United States Patent
Ohtsuka et al.

(10) Patent No.: US 8,415,798 B2
(45) Date of Patent: Apr. 9, 2013

(54) SEMICONDUCTOR DEVICE HAVING A CONDUCTOR BURIED IN AN OPENING

(75) Inventors: Nobuyuki Ohtsuka, Kawasaki (JP); Noriyoshi Shimizu, Tokyo (JP)

(73) Assignee: Fujitsu Semiconductor Limited, Yokohama (JP)

(*) Notice: Subject to any disclaimer, the term of this patent is extended or adjusted under 35 U.S.C. 154(b) by 0 days.

(21) Appl. No.: 12/816,704

(22) Filed: Jun. 16, 2010

(65) Prior Publication Data
US 2010/0252928 A1    Oct. 7, 2010

Related U.S. Application Data

(63) Continuation of application No. PCT/JP2008/053392, filed on Feb. 27, 2008.

(51) Int. Cl.
*H01L 23/48*    (2006.01)
(52) U.S. Cl. ......... 257/751; 257/E21.584; 257/E23.011; 438/653
(58) Field of Classification Search .................. 257/751, 257/E21.584, E23.011; 438/653
See application file for complete search history.

(56) References Cited

U.S. PATENT DOCUMENTS

| | | | |
|---|---|---|---|
| 6,664,179 B2 | 12/2003 | Akbar et al. | |
| 7,304,384 B2 | 12/2007 | Koike et al. | |
| 2004/0056366 A1* | 3/2004 | Maiz et al. | 257/779 |
| 2005/0106820 A1* | 5/2005 | Tran | 438/270 |
| 2005/0218519 A1* | 10/2005 | Koike et al. | 257/756 |
| 2007/0020931 A1 | 1/2007 | Koura et al. | |
| 2007/0045851 A1 | 3/2007 | Kitada et al. | |
| 2008/0174021 A1* | 7/2008 | Choi et al. | 257/751 |

FOREIGN PATENT DOCUMENTS

| | | |
|---|---|---|
| JP | 2-62035 A | 3/1990 |
| JP | 2001-230219 A | 8/2001 |
| JP | 2002-146535 A | 5/2002 |
| JP | 2003-218198 A | 7/2003 |
| JP | 2005-277390 A | 10/2005 |
| JP | 2006-57162 A | 3/2006 |
| JP | 2007-027259 A | 2/2007 |
| JP | 2007-059660 A | 3/2007 |
| JP | 2007-059734 A | 3/2007 |
| JP | 2007-96241 A | 4/2007 |
| JP | 2007-141927 A | 6/2007 |
| JP | 2007-287816 A | 11/2007 |
| JP | 2008-047578 A | 2/2008 |

OTHER PUBLICATIONS

International Search Report of PCT/JP2008/053392, mailing date of May 13, 2008.
T. Usui et al., "Low Resistive and Highly Reliable Cu Dual-Damascene Interconnect Technology Using Self-Formed MnSixOy Barrier Layer", Interconnect Technology Conference, Jun. 6-8, 2005, pp. 188-190, Cited in Spec.

(Continued)

*Primary Examiner* — Zandra Smith
*Assistant Examiner* — Marvin Payen
(74) *Attorney, Agent, or Firm* — Fujitsu Patent Center

(57) ABSTRACT

A semiconductor device includes a first conductor formed over a semiconductor device; an insulation film formed over the semiconductor substrate and the first conductor and having an opening arriving at the first conductor; a first film formed in the opening and formed of a compound containing Zr; a second film formed over the first film in the opening and formed of an oxide containing Mn; and a second conductor buried in the opening and containing Cu.

7 Claims, 34 Drawing Sheets

OTHER PUBLICATIONS

Junghwan Sung et al., "Remote-Plasma Chemical Vapor Deposition of Conformal ZrB2 Films at Low Temperature: A Promising Diffusion Barrier for Ultralarge Scale Integrated Electronics", Journal of Applied Physics, Mar. 15, 2002, pp. 3904-3911, vol. 91, No. 6., Cited in Spec.

* cited by examiner

SEMICONDUCTOR DEVICE HAVING A CONDUCTOR BURIED IN AN OPENING

CROSS-REFERENCE TO RELATED APPLICATION

This application is a continuation of PCT application No. PCT/JP2008/053392, which was filed on Feb. 27, 2008, and which designated the United States of America, the entire contents of which are incorporated herein by reference.

FIELD

The embodiments discussed herein are related to a semiconductor device and a method for manufacturing a semiconductor device.

BACKGROUND

Recently, to realize the low resistivity of conductor plugs and interconnections, the use of Cu as a material of the conductor plugs and interconnections is noted.

Cu film is a material which is difficult to dry etching. Thus, Cu film is buried in contact holes or trenches by forming the contact holes or the trenches in an inter-layer insulation film, forming a Cu film on the inter-layer insulation film with the contact holes or trenches formed in and then polishing the Cu film until the surface of the inter-layer insulation film is exposed. Such process of burying Cu film in contact holes or trenches is called damascene process.

When the conductor plugs or the interconnections of Cu film directly contact the inter-layer insulation film, Cu atoms in the conductor plugs or the interconnections diffuse into the inter-layer insulation film, resultantly causing problems of short-circuits, etc. To prevent the problems, a barrier film for preventing the diffusion of the Cu atoms is formed in the contact holes or the trenches. As a material of such barrier film, Ta film or others, for example, is used.

Recently, to realize further scaling down semiconductor devices, the diameter of the contact holes for the conductor plugs to be buried in, and the width of the trenches for the interconnections to be buried in are required to be much reduced. To much reduce the diameter of the contact holes, it is necessary to extremely thin the barrier film.

Related references are as follows:
Japanese Laid-open Patent Publication No. 02-62035;
Japanese Laid-open Patent Publication No. 2003-218198;
Japanese Laid-open Patent Publication No. 2005-277390;
Japanese Laid-open Patent Publication No. 2007-59660;
Japanese Laid-open Patent Publication No. 2006-57162;
Japanese Laid-open Patent Publication No. 2002-146535;
Japanese Laid-open Patent Publication No. 2007-27259;
Japanese Laid-open Patent Publication No. 2007-96241;
Japanese Laid-open Patent Publication No. 2001-230219;
Japanese Laid-open Patent Publication No. 2007-141927;
T. Usui et al., "Low Resistive and Highly Reliable Cu Dual-Damascene Interconnect Technology Using Self-Formed MnSixOy Barrier Layer", International Interconnect Technology Conference, 2005 (IITC 2005), Jun. 6-8, 2005, pp. 188-190; and
Junghwan Sung et al., "Remove-Plasma chemical vapor deposition of conformal $ZrB_2$ films at low temperature; A promising diffusion barrier for ultralarge scale integrated electronics", Journal of Applied Physics, Volume 91, Number 6, pp. 3904-3911 (2002).

SUMMARY

According to an aspect of embodiments, a semiconductor device includes a first conductor formed over a semiconductor device; an insulation film formed over the semiconductor substrate and the first conductor and having an opening arriving at the first conductor; a first film formed in the opening and formed of a compound containing Zr; a second film formed over the first film in the opening and formed of an oxide containing Mn; and a second conductor buried in the opening and containing Cu.

According to another aspect of embodiments, a semiconductor device includes: a first conductor formed over a semiconductor substrate; an insulation film formed over the semiconductor substrate and the first conductor and having an opening arriving at the first conductor; a polycrystalline first film formed in the opening; a second film formed over the first film in the opening and formed of an oxide containing Mn; and a second conductor buried in the opening and containing Cu.

According to further another aspect of embodiments, a semiconductor device manufacturing method includes: forming a first conductor over a semiconductor substrate; forming an insulation film over the semiconductor substrate and over the first conductor; forming in the insulation film an opening arrived to the first conductor; forming in the opening a first film formed of a compound containing Zr; forming a second film containing Cu and Mn over the first film in the opening; forming a second conductor containing Cu in the opening; and oxidizing Mn in the second film to change the second film into a third film formed of an oxide containing Mn by thermal processing.

The object and advantages of the embodiments will be realized and attained by means of the elements and combinations particularly pointed out in the claims.

It is to be understood that both the foregoing general description and the following detailed description are exemplary and explanatory and are not restrictive of the embodiments, as claimed.

DESCRIPTION OF EMBODIMENTS

However, the barrier film of Ta or others which is formed extremely thin has the barrier ability deteriorated. The inter-layer insulation film of, especially, porous material or others emits much water and oxygen gas. When the inter-layer insulation film is formed of a porous material or others, the barrier film is deteriorated by the water, the oxygen gas, etc.

Preferred embodiments of the present invention will be explained with reference to accompanying drawings.

First Embodiment

The semiconductor device according to a first embodiment and the method for manufacturing the semiconductor device will be explained with reference to FIGS. 1 to 9.

(Semiconductor Device)

Figure 1:
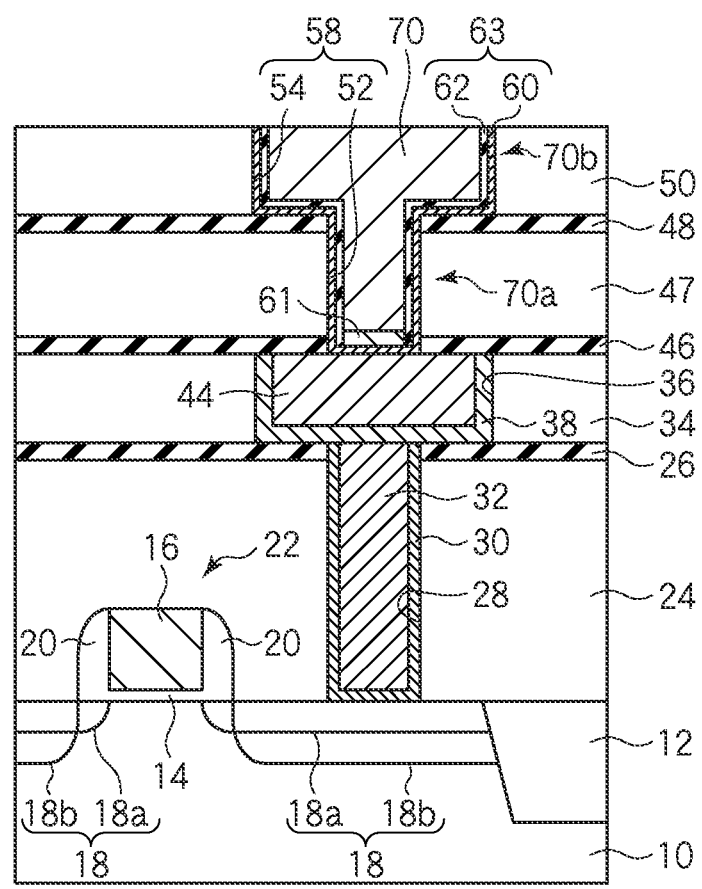
FIG. 1 is a cross sectional view of a semiconductor device according to a first embodiment.

First, the semiconductor device according to the present embodiment will be described with reference to FIG. 1. FIG. 1 is a cross sectional view of the semiconductor device according to the present embodiment.

As illustrated in FIG. 1, device isolation regions 12 for defining device regions are formed in a semiconductor substrate 10 of, e.g., silicon.

On each device region defined by the device isolation regions 12, a gate electrode 16 is formed with a gate insulation film 14, e.g., a 1.5-10 nm film thickness formed.

In the semiconductor substrate 10 on both sides of each gate electrode 16, impurity diffused regions 18a forming the shallow regions of the extension source/drain structure, i.e., extension regions 18a are formed.

On the side wall of the gate electrode 16, a sidewall insulation film 20 of silicon oxide film is formed.

In the semiconductor substrate 10 on both sides of the gate electrode 16 with the sidewall insulation film 20 formed on, impurity diffused regions 18b forming the deep regions of the extension source/drain structure are formed. The shallow impurity diffused regions 18a and the deep impurity diffused regions 18b form a source/drain diffused layer 18 of the extension source/drain structure.

Thus, a transistor 22 including the gate electrode 16 and the source/drain diffused layer 18 is formed.

On the semiconductor substrate 10 with the transistors 22 formed on, an inter-layer insulation film of, e.g., silicon oxide film is formed. The film thickness of the inter-layer insulation film 24 is, e.g., 300 nm.

On the inter-layer insulation film 24, a protection film 26 of, e.g., SiOC is formed. The film thickness of the protection film 26 is, e.g., about 50 nm.

The protection film 26 is formed of SiOC film here, but the material of the protection film 26 is not limited to SiOC film. For example, SiC film, SiN film, or others may be used as the protection film 26.

In the protection film 26 and the inter-layer insulation film 24, a contact hole 28 is formed down to the source/drain diffused layer 18.

In the contact hole 28, a barrier metal film 30 of, e.g., TiN is formed. The film thickness of the barrier metal film 30 is, e.g., 25 nm.

In the contact hole 28 with the barrier metal film 30 formed in, a conductor plug 32 of, e.g., tungsten is buried in.

On the protection film 26 with the conductor plugs 32 buried in, an inter-layer insulation film 34 of, e.g., a low dielectric constant film is formed. As the inter-layer insulation film 34, a porous low dielectric constant film, for example, is used. The film thickness of the inter-layer insulation film 34 is, e.g., 150 nm.

As the inter-layer insulation film 34, the porous low dielectric constant film is formed here. However, the inter-layer insulation film 34 is not limited to the porous low dielectric constant film. For example, as the inter-layer insulation film 34, a low dielectric film without pores formed in may be used. As the inter-layer insulation film 34, the ordinary silicon oxide film may be used.

In the inter-layer insulation film 34, a trench 36 for exposing the upper surface of the conductor plug 32 is formed. The trench 36 is for an interconnection 44 to be buried in. The width of the trench 36 is, e.g., about 70 nm-3 μm.

A barrier film 38 of, e.g., Ta is formed on the side wall and the bottom surface of the trench 36. The film thickness of the barrier metal film 38 is, e.g., about 10 nm. The relatively large width of the trench 36, which is 70 nm-3 μm, allows the thickness of the barrier metal film 38 to be set relatively large. The barrier metal film 38, which can be formed relatively thick, never deteriorate the barrier ability even if water and oxygen are emitted from the inter-layer insulation film 34. This permits Ta or others to be used as the material of the barrier metal film 38 formed in the trench 36.

The barrier metal film 38 is formed of Ta film here, but the material of the barrier metal film 38 is not limited to Ta film. For example, the barrier metal film 38 may be formed of Ti film, TaN film, TiN film or others.

In the trench 36 with the barrier metal film 38 formed on, an interconnection 44 of Cu or a Cu alloy is buried in.

On the inter-layer insulation film 34 with the interconnection 44 buried in, a cap film 46 of, e.g., SiC is formed. The film thickness of the cap film 46 is about, e.g., 50 nm. The cap film 46 is to be the etching stopper in etching the inter-layer insulation film 47, etc.

The cap film 46 is formed of SiC film here but is not limited to SiC. For example, the cap film 46 may be formed of SiC film, SiON film, SiOC film, SiON film or others.

On the cap film 46, an inter-layer insulation film 47 of, e.g., a low dielectric constant film is formed. The inter-layer insulation film 47 is formed of, e.g., a porous low dielectric constant film. The film thickness of the inter-layer insulation film 47 is, e.g., 150 nm.

The inter-layer insulation film 47 is formed of a porous dielectric constant film here but is not limited to a porous low dielectric constant film. For example, the inter-layer insulation film 47 may be formed of a low dielectric constant film without porous formed in. The inter-layer insulation film 47 may be formed of the ordinary silicon oxide film.

On the inter-layer insulation film 47, an etching stopper film 48 of, e.g., SiC is formed. The film thickness of the etching stopper film 48 is, e.g., about 30 nm.

The etching stopper film 48 is formed of SiC film here but is not limited to SiC film. For example, the etching stopper film 48 may be of SiN film, SiOC film, SiON film or others.

On the etching stopper film 48, an inter-layer insulation film 50 of, e.g., a low dielectric constant film is formed. The inter-layer insulation film 50 is formed of, e.g., a porous low dielectric constant film. The film thickness of the inter-layer insulation film 50 is, e.g., 150 nm.

The inter-layer insulation film 50 is formed of a porous low dielectric constant film here but is not limited to a porous low dielectric constant film. For example, the inter-layer insulation film 50 may be formed of a low dielectric constant film without porous formed in. The inter-layer insulation film 50 may be formed of the ordinary silicon oxide film.

In the etching stopper film 48, the inter-layer insulation film 47 and the cap film 46, a contact hole 52 is formed down to the interconnection 44. The contact hole 52 is for a conductor plug 70a to be buried in. The diameter of the contact hole 52 is, e.g., 100 nm or below.

In the inter-layer insulation film 50, a trench 54 is formed, connected to the upper part of the contact hole 52. The trench 54 is for an interconnection 70b to be buried in. The width of the trench 54 is, e.g., 100 nm or below.

Thus, an opening 58 including the contact hole 52, and the trench 54 connected to the upper part of the contact hole 52 is formed.

In the opening 58, the first film (adhesion film) 60 of a compound containing Zr is formed. The first film 60 is formed of $ZrB_2$ film here. The $ZrB_2$ film 60 is formed on the side wall and the bottom surface of the contact hole 52 and on the side surface and the bottom surface of the trench 54. The $ZrB_2$ film 60 is polycrystalline conduction film. The $ZrB_2$ film 60 contains no carbon. The $ZrB_2$ film 60 is formed in a substantially uniform film thickness. The film thickness of the $ZrB_2$ film 60 is, e.g., 1-10 nm. More preferably, the film thickness of the $ZrB_2$ film 60 is 1-5 nm.

In the present embodiment, as the material of the first film 60, $ZrB_2$ film is used for the following reasons.

That is, the $ZrB_2$ film 60, which contains Zr, is suitable to ensure the adhesion with the base of the conductor plug 70a and the conductor plug 70b formed of Cu.

The $ZrB_2$ film 60 can be formed by CVD (Chemical Vapor Deposition), and can be formed uniformly thin. Besides, the $ZrB_2$ film 60 can ensure sufficient adhesion even formed thin. The film thickness of the first film 60 can be set small, which allows the film thickness of a base film 63 to be described later to be set small. Thus, the first film 60 is formed of $ZrB_2$ film, whereby even when the diameter of the contact hole 52 and the width of the trench 54 are made small, the diameter of the conductor plug 70a and the width of the interconnection 70b can be made sufficiently large.

The $ZrB_2$ film 60 can be formed of inorganic raw materials, and $ZrB_2$ film 60 containing no carbon can be formed. The specific resistance of the $ZrB_2$ film formed of $Zr[N(C_2H_5)_2]_4$, which is an organic raw material, is 600 $\mu\Omega\cdot cm$ or above, which is relatively large while the specific resistance of the $ZrB_2$ film formed of $Zr(BH_4)_4$, which is an inorganic raw material, is about 4.6 $\mu\Omega\cdot cm$, which is extremely small. When the $ZrB_2$ film containing no carbon is used as the first film 60, the contact resistance between the conductor plugs 70a and the interconnections 44 can be sufficiently low.

The $ZrB_2$ film 60 is polycrystalline. The polycrystalline film, which has grain boundaries, permits oxygen to pass through. That is, oxygen emitted from the inter-layer insulation films 47, 50, etc. tends to be supplied to the CuMn film 61 (see FIGS. 8A) via the grain boundaries of the $ZrB_2$ film 60. Accordingly, the first film 60 is formed of $ZrB_2$ film, whereby the CuMn film 61 can be changed to the $MnO_x$ film 62 without failure.

For such reasons, the first film 60 is formed of $ZrB_2$ film in the present embodiment.

In the opening 58 with the $ZrB_2$ film 60 formed in, the second film (barrier film) 62 of an oxide containing Mn is formed. The second film 62 is formed of $MnO_x$ film here. The second film 62 is formed on the side wall of the contact hole 52 with the $ZrB_2$ film 60 formed in and on the side wall and the bottom surface of the trench 54 with the $ZrB_2$ film 60 formed in. The second film 62 is in contact with the first film 60. The film thickness of the second film 62 is about 2-5 nm. The second film 62 of $MnO_x$ functions as the barrier film for preventing the diffusion of Cu.

In the present embodiment, the second film 62 is formed of $MnO_x$ film for the following reasons.

That is, the $MnO_x$ film 62 can be formed on the side wall of the contact hole 52 and on the side wall and the bottoms surface of the trench 54 by oxidizing the CuMn film 61 with oxygen emitted from the inter-layer insulation films 50, 47, etc.

Even when the film thickness of the $MnO_x$ film 62 is set small, the diffusion of Cu can be sufficiently prevented. Not only the film thickness of the first film 60, but also the film thickness of the second film 62 can be set small, whereby the film thickness of the base film 63 of the first film 60 and the second film 62 can be set small. Thus, the second film 62 is formed of $MnO_x$ film, whereby even when the diameter of the contact hole 52 and the width of the trench 54 are set small, the diameter of the conductor plug 70a and the width of the interconnection 70b can be sufficiently large.

For such reasons, in the present embodiment, the second film 62 is formed of $MnO_x$ film.

On the first film 60 at the bottom of the contact hole 52, a conduction film 61 of CuMn is formed. The film thickness of the conduction film 61 is, e.g., about 5 nm.

In the opening 58 with the base film 63 and the conduction film 61 formed in, a conductor 70 of Cu or a Cu alloy is buried. That is, the conductor 70 including the conductor plugs 70a and an interconnection 70b formed integral with the conductor plug 70a is buried in the opening 58.

On the inter-layer insulation film 50 with the conductor plug 70a and the interconnection 70b buried in, interconnections not illustrated are further formed.

Thus, the semiconductor device according to the present embodiment is constituted.

As described above, in the present embodiment, the base film 63 is formed of the $ZrB_2$ film 60 which can sufficiently ensure the adhesion even when the film thickness is set small, and the $MnO_x$ film 62 which can sufficiently prevent the diffusion of Cu even when the film thickness is set small. According to the present embodiment, the film thickness of the base film 63 can be set extremely small without deteriorating the adhesion and the barrier ability, whereby the conductor plugs and the interconnections can be micronized without impairing the reliability.

(Method for Manufacturing the Semiconductor Device)

Next, the method for manufacturing the semiconductor device according to the present embodiment will be described with reference to FIGS. 2A to 9. FIGS. 2A to 9 are cross sectional views of the semiconductor device according to the present embodiment, in the steps of the method for manufacturing the semiconductor device, which illustrate the method.

Figure 2A:
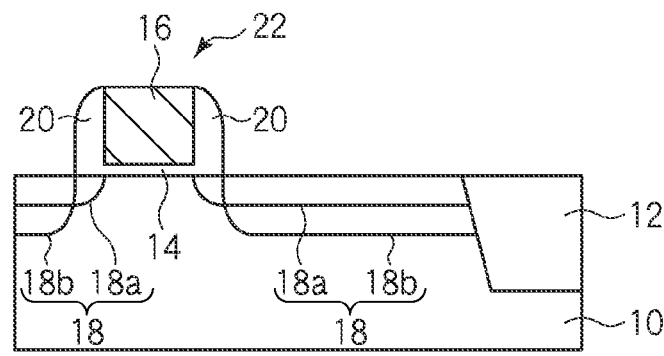
FIGS. 2A to 9 are cross sectional views of the semiconductor device according to the first embodiment in the steps of the method for manufacturing the semiconductor device, which illustrate the method.

First, as illustrated in FIG. 2A, on the semiconductor substrate 10 of, e.g., silicon, the device isolation regions 12 for defining the device regions are formed. The device isolation regions 12 can be formed by, e.g., STI (Shallow Trench Isolation).

Then, the gate insulation film 14 of a 1.5-10 nm-film thickness is formed on the entire surface. The gate insulation film 14 is formed by, e.g., thermal oxidation.

Then, a 100 nm-thickness polysilicon film is formed on the entire surface. Then, the polysilicon film is patterned into the configuration of the gate electrodes 16 by photolithography. For patterning the polysilicon film, anisotropic dry etching, for example, is used. Thus, the gate electrodes 16 of polysilicon are formed.

Next, by, e.g., ion implantation, a dopant impurity is implanted into the semiconductor substrate 10 on both sides of each gate electrode 16 with the gate electrode 16 as the mask. Thus, in the semiconductor substrate 10 on both sides of each gate electrode 16, the impurity diffused regions 18a forming the shallow regions of the extension source/drain structure, i.e., the extensions 18a are formed.

Next, on the entire surface, a 40-50 nm-thickness silicon oxide film is formed by, e.g., CVD.

Next, the silicon oxide film is anisotropically etched. Thus, on the side walls of the gate electrodes 16, the sidewall insulation film 20 of silicon oxide film is formed.

Then, by, e.g., ion implantation, a dopant impurity is implanted into the semiconductor substrate 10 with the gate electrodes 16 and the sidewall insulation film 20 as the mask. Thus, in the semiconductor substrate on both sides of each gate electrode 16 with the sidewall insulation film 20 formed on, the impurity diffused regions 18b forming the deep regions of the extension source/drain structure are formed. The shallow impurity diffused regions 18a and the deep impurity diffused regions 18b form the source/drain diffused layers 18 of the extension source/drain structure.

Then, by, e.g., the thermal processing for activating the dopant impurities implanted in the source/drain diffused layers 18 is made by, e.g., RTA (Rapid Thermal Annealing).

Thus, transistors 22 each including the gate electrode 16 and the source/drain diffused layers 18 are formed.

Figure 2B:
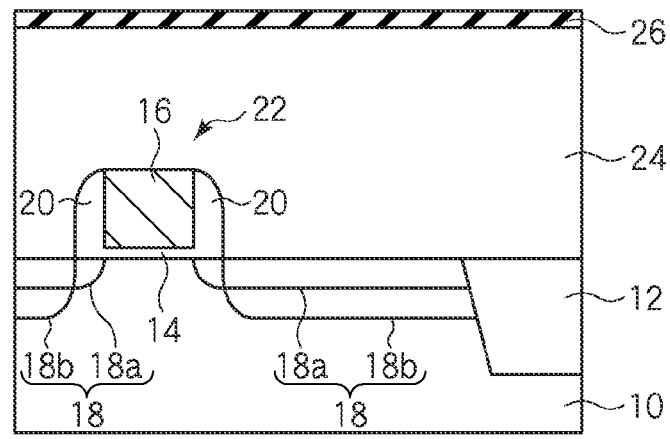

Then, as illustrated in FIG. 2B, the inter-layer insulation film 24 of, e.g., silicon oxide film is formed on the entire surface by, e.g., CVD. The film thickness of the inter-layer insulation film 24 is, e.g., 300 nm.

Next, the protection film 26 of, e.g., SiOC is formed on the entire surface by, e g., CVD. The film thickness of the protection film 26 is, e.g., about 50 nm.

The protection film 26 is formed of SiOC film here but is not limited to SiOC film. For example, SiC film, SiN film or others can be used as the protection film 26.

Figure 2C:
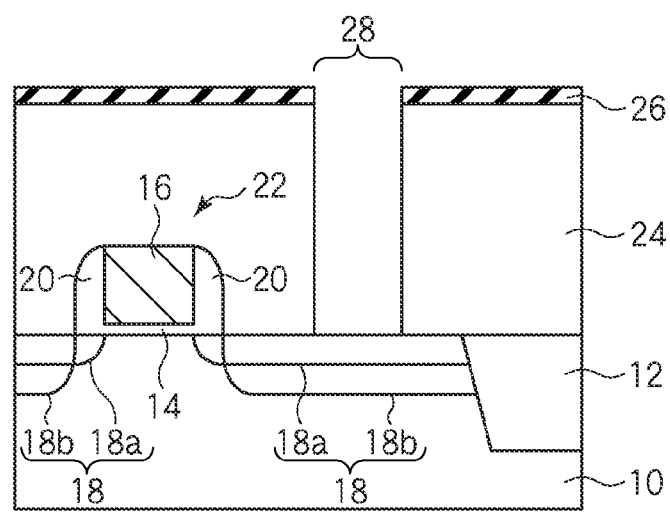

Next, by photolithography, the contact holes 28 are formed in the protection film 26 and the inter-layer insulation film 24 down to the source/drain diffused layers 18 (see FIG. 2C).

Next, the barrier metal film 30 is formed on the entire surface by, e.g., sputtering. The barrier metal film 30 is formed of, e.g., TiN film. The film thickness of the barrier metal film 30 is, e.g., 25 nm.

Then, the conduction film 32 of, e.g., tungsten is formed on the entire surface by, e.g., CVD. The film thickness of the conduction film 32 is, e.g., 200 nm.

Next, the conduction film 32 is polished by, e.g., CMP (Chemical Mechanical Polishing) until the surface of the protection film 26 is exposed. Thus, the conductive plugs 32 of tungsten are buried in the contact holes 28 (see FIG. 3A).

Figure 3A:
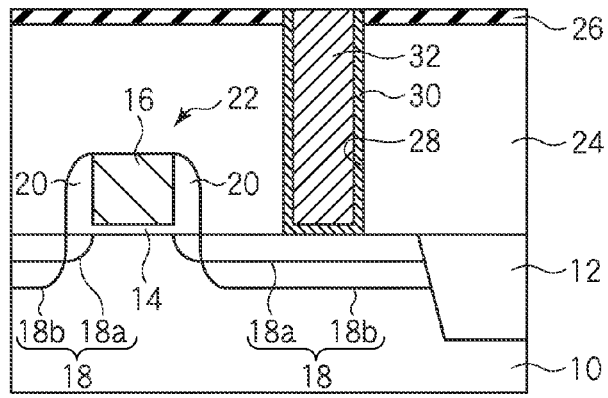
Figure 3B:
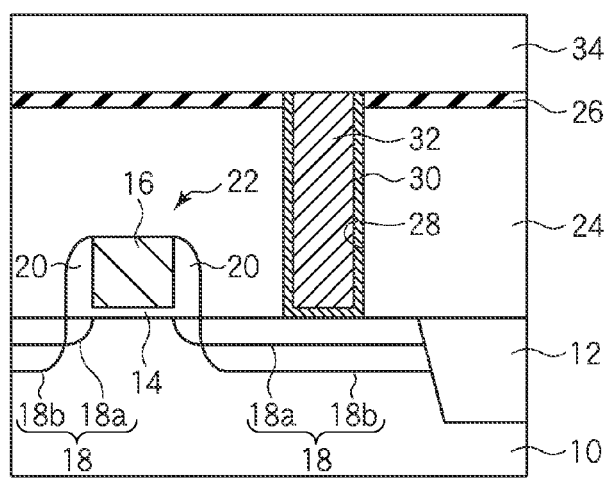
Figure 3C:
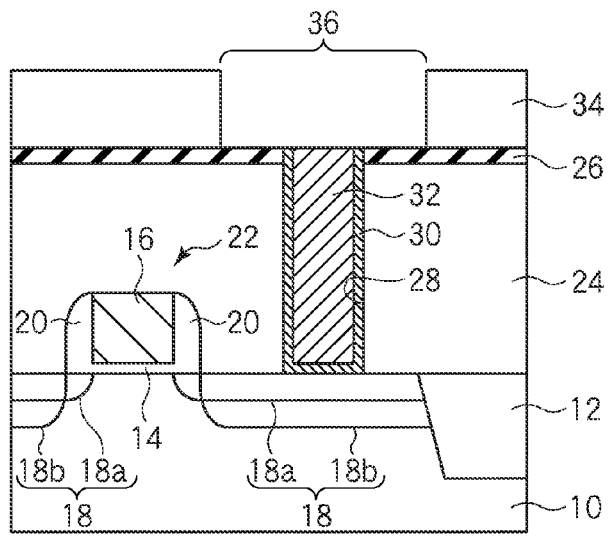

Then, as illustrated in FIG. 3B, the inter-layer insulation film 34 of, e.g., a low dielectric constant film is formed on the entire surface. The inter-layer insulation film 34 is formed of, e.g., porous low dielectric constant film. The film thickness of the inter-layer insulation film 34 is, e.g., 150 nm.

The inter-layer insulation film 34 is formed of a porous low dielectric constant film here but is not limited to a porous dielectric constant film. For example, the inter-layer insulation film 34 may be formed of a low dielectric constant film without pores formed in. The inter-layer insulation film 34 may be formed of the ordinary silicon oxide film.

Then, the trenches 36 for exposing the upper surfaces of the conductor plugs 32 are formed in the inter-layer insulation film 34 by photolithography. The trenches 36 are for the interconnections 38 to be described later to be buried in. The width of the trenches 36 is, e.g., 70 nm-3 μm (see FIG. 3C).

Figure 4A:
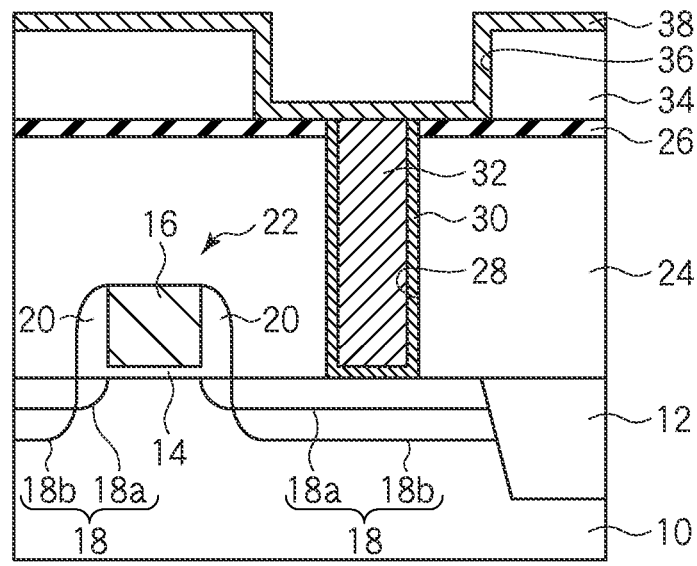

Next, as illustrated in FIG. 4A, the barrier film 38 of, e.g., Ta is formed on the entire surface by, e.g., sputtering. The film thickness of the barrier film 38 is, e.g., about 10 nm. The relatively large width of the trenches 36, which is about 70 nm-3 μm, allows the thickness of the barrier film 38 to be set relatively large. The barrier film 38, which can be formed relatively thick, never much deteriorate the barrier ability even if water and oxygen are emitted from the inter-layer insulation film 34. Accordingly, the barrier metal film 38 to be formed in the trenches 36 can be formed of Ta film.

The barrier metal film 38 is formed of Ta film here but is not limited to Ta film. The barrier metal film 38 may be formed of, e.g., Ti film, TaN film, TiN film or others.

Figure 4B:
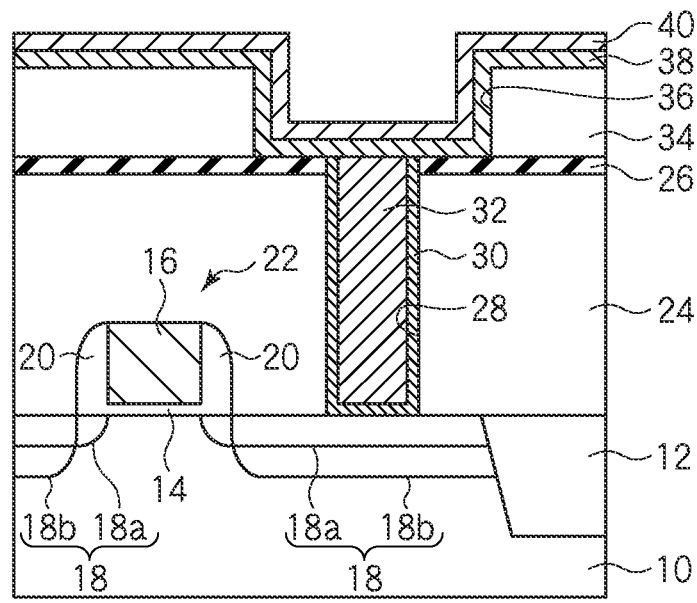

Then, as illustrated in FIG. 4B, a seed film 40 of Cu is formed on the entire surface by, e.g., sputtering. The film thickness of the seed film 40 is, e.g., 50 nm.

Figure 5A:
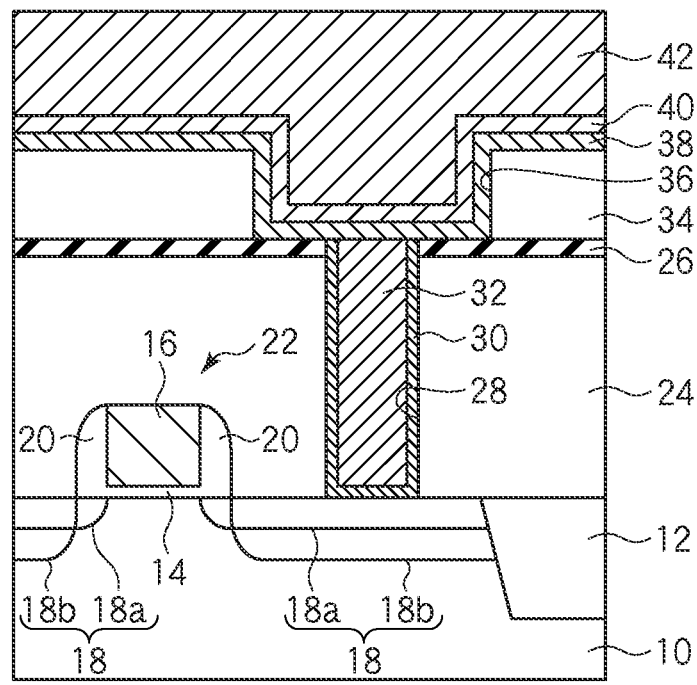

Then, as illustrated in FIG. 5A, a Cu film 52 is formed on the entire surface by, e.g., electroplating. The film thickness of the Cu film 42 is, e.g., 1 μm.

Then, the Cu film 42, the seed film 40 and the barrier film 38 are polished by, e.g., CMP until the surface of the inter-layer insulation film 34 is exposed.

Figure 5B:
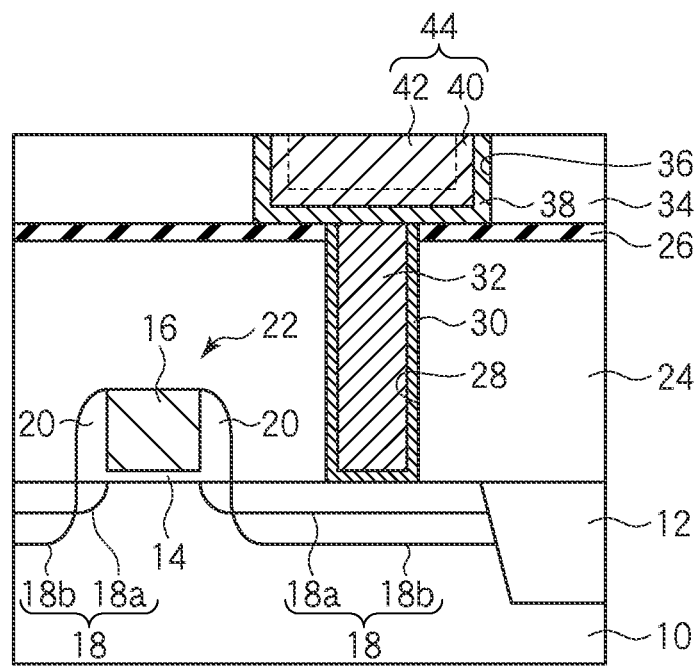

Thus, the interconnections 44 of Cu are buried in the trenches 36 by single damascene process (see FIG. 5B).

Next, the cap film 46 of, e.g., SiC is formed on the entire surface by, e.g., CVD. The film thickness of the cap film 46 is about 30 nm. The cap film 46 is to be the etching stopper in etching the inter-layer insulation film 47, etc.

Then, the inter-layer insulation film 47 of, e.g., a low dielectric constant film is formed on the entire surface by, e.g., CVD. The inter-layer insulation film 47 is formed of, e.g., a porous low dielectric constant film. The film thickness of the inter-layer insulation film 47 is, e.g., 150 nm.

The inter-layer insulation film 47 is formed of a porous low dielectric constant film here but is not limited to a porous low dielectric constant film. For example, the inter-layer insulation film 47 may be formed of a low dielectric constant film without pores formed in. The inter-layer insulation film 47 may be formed of the ordinary silicon oxide film.

Next, the etching stopper film 48 of, e.g., SiC is formed on the entire surface by, e.g., CVD. The film thickness of the etching stopper film 48 is, e.g., about 20 nm.

The etching stopper film 48 is formed of SiC film here but is not limited to SiC film. For example, the etching stopper film 48 may be formed of, SiN film, SiOC film, SiON film or others.

Then, the inter-layer insulation film 50 of, e.g., a low dielectric constant film on the entire surface by, e.g., CVD (see FIG. &A). The inter-layer insulation film 50 is formed of, e.g., a porous dielectric constant film. The film thickness of the inter-layer insulation film 50 is, e.g., 150 nm.

The inter-layer insulation film 50 is formed of a porous low dielectric constant film here but is not limited to a porous low dielectric constant film. For example, the inter-layer insulation film 50 may be formed of a low dielectric constant film without pores formed in. The inter-layer insulation film 50 may be formed of the ordinary silicon oxide film.

Then, a photoresist film (not illustrated) is formed by, e.g., spin coating.

Next, by photolithography, openings (not illustrated) for forming the contact holes 52 are formed in the photoresist film.

Next, with the photoresist film as the mask, the contact holes 52 are formed down to the interconnections 44. Then, the photoresist film is released.

Next, a photoresist film (not illustrated) is formed by, e.g., spin coating.

Next, by photolithography, openings (not illustrated) for forming the trenches 54 are formed in the photoresist film.

Next, the inter-layer insulation film 50 is etched with the photoresist film as the mask and with the etching stopper film 46 as the stopper.

Figure 6A:
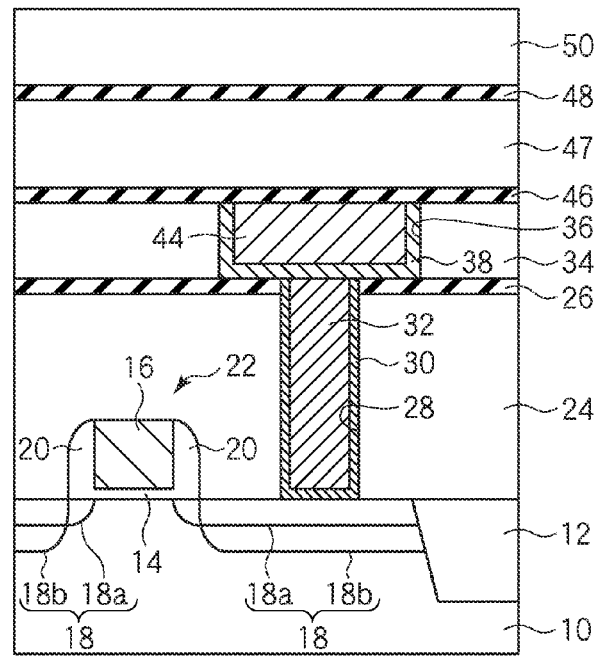
Figure 6B:
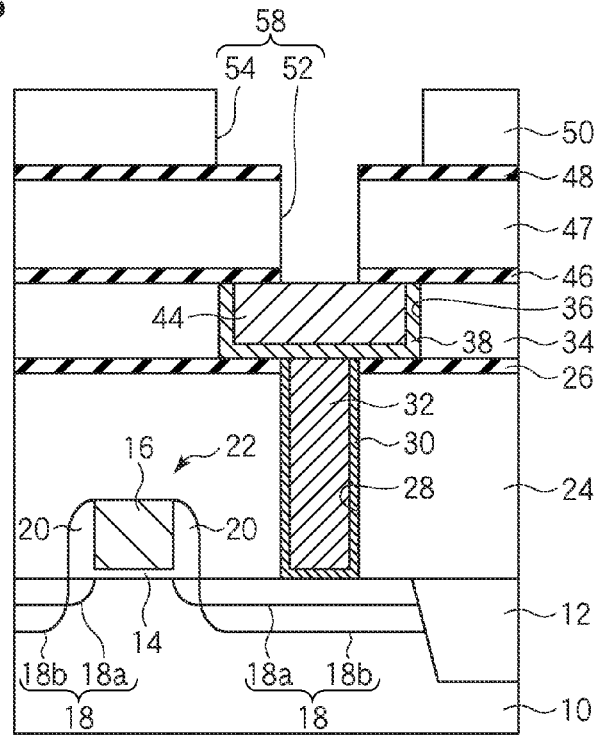

Thus the openings 58 including the contact holes 52 arriving at the interconnections 44 and the trenches 54 connected to the upper parts of the contact holes 52 are formed in the inter-layer insulation films 47, 50 (see FIG. 6B).

Figure 7A:
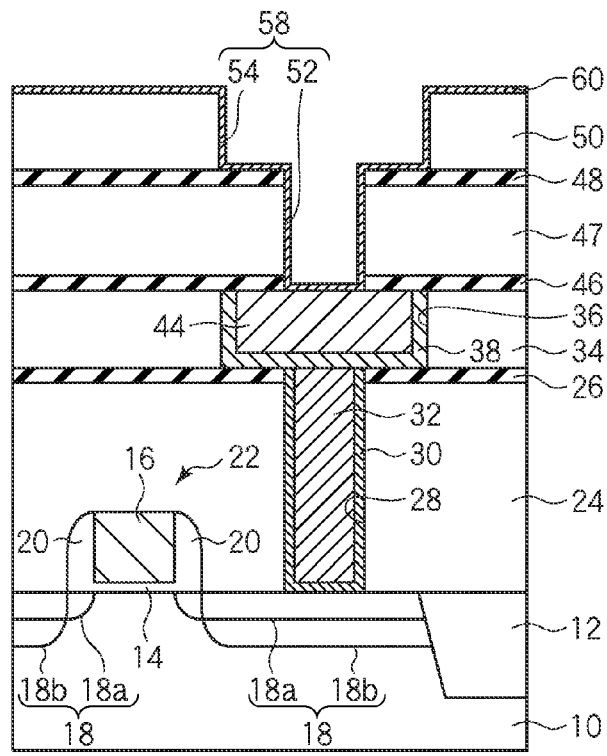

Then, as illustrated in FIG. 7A, the $ZrB_2$ film is formed on the entire surface by, e.g., remote plasma CVD. The film thickness of the $ZrB_2$ film 60 is, e.g., 1-10 nm. More preferably, the film thickness of the $ZrB_2$ film 60 is, e.g., 1-5 nm. As the raw material for forming the $ZrB_2$ film 60 is $Zr(BH_4)_4$, which is an inorganic raw material. $Zr(BH_4)_4$ is a solid raw material. The film forming conditions for forming the $ZrB_2$ film 60 are as exemplified below. As the carrier gas, Ar gas, for example, is used. As the gas for generating plasmas, $H_2$ gas, for example, is used. As the substrate temperature is, e.g., 150-250° C. The pressure inside the filming forming chamber is, e.g., about 100 Pa.

In the present embodiment, for the following reasons, the $ZrB_2$ film 60 is formed with $Zr(BH_4)_4$, which is an inorganic raw material.

That is, the $ZrB_2$ film formed with $Zr[N(C_2H_5)_2]_4$, which is an organic raw material, has a specific resistance of 600 $\mu\Omega\cdot cm$ or above, which is relatively large because of carbon contained in the $ZrB_2$ film, while the $ZrB_2$ film 60 formed with $Zr(BH_4)_4$, which is an inorganic raw material, has a relatively small specific resistance of about 4.6 $\mu\Omega\cdot cm$ because of no carbon contained. Thus, by forming the $ZrB_2$ film 60 with $Zr(BH_4)_4$, which is an inorganic raw material, the contact resistance between the conductor plugs 70a and the interconnections 44 can be sufficiently low.

The vapor pressure of the $Zr[N(C_2H_5)_2]_4$, which is an organic raw material is 0.1 Torr at 120° C., while the vapor pressure of $Zr(BH_4)_4$, which is an inorganic raw material, is 17 Torr at 25° C. That is, $Zr(BH_4)_4$, whose vapor pressure is relatively high, residue of the raw material does not easily adhere to reactors and pipes, and is relatively easy to treat.

For these reasons, in the present embodiment, the $ZrB_2$ film 60 is formed with $Zr(BH_4)_4$, which is an inorganic raw material.

Figure 7B:
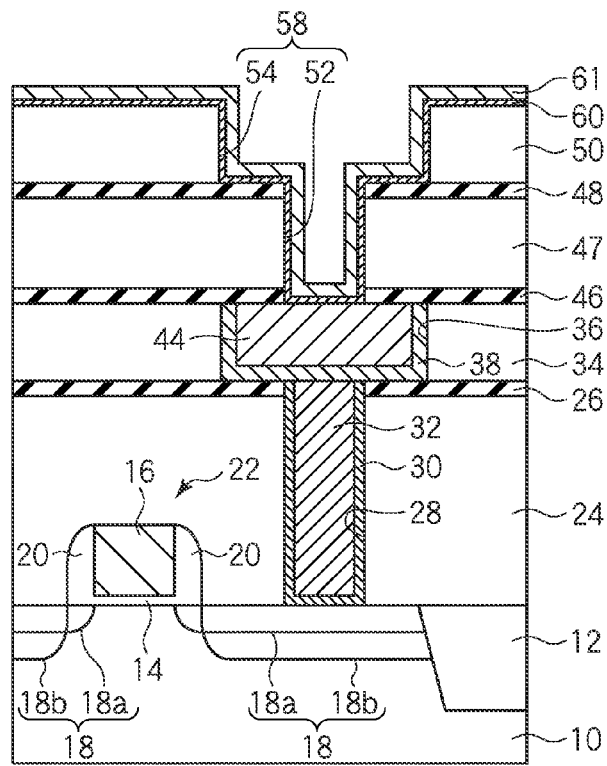

Next, as illustrated in FIG. 7B, the CuMn film 61 is formed on the entire surface by, e.g., physical vapor deposition. Specifically, the CuMn film 61 is formed by, e.g., sputtering. The film thickness of the CuMn film 61 is, e.g., 10-40 nm. As the target for forming the CuMn film 61m, a target of CuMn of a 0.1-30 atom % Mn concentration is used.

In the present embodiment, the CuMn film 61 is formed by using the target of CuMn of a 0.1-30 atom % Mn concentration for the following reasons.

That is, when the CuMn film 61 is formed by using a target of CuMn of an Mn concentration which is smaller than 1 atom %, the quantity of the Mn in the CuMn film 61 is too small, which makes it difficult to form the $MnO_x$ film 62 of a sufficient film thickness in the later step. On the other hand, when the CuMn film 61 is formed by using a target of CuMn of an Mn concentration which is larger than 30 atom %, which makes it difficult to form the CuMn film 61 of good quality.

For such reason, in the present embodiment, the CuMn film 61 is formed by using the target of CuMn of a 0.1-30 atom % Mn concentration.

The CuMn film 61 formed by using such target has an Mn concentration of, e.g., 0.1-10 atom %.

Figure 8A:
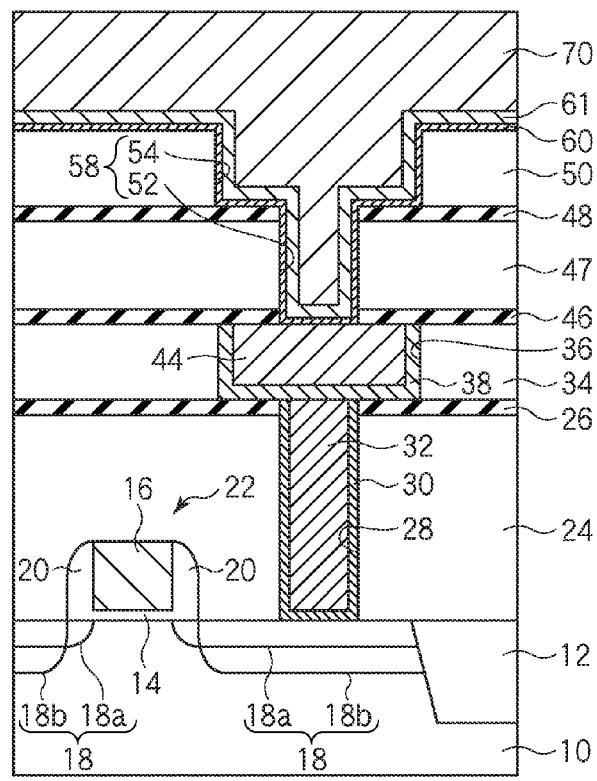
Figure 8B:
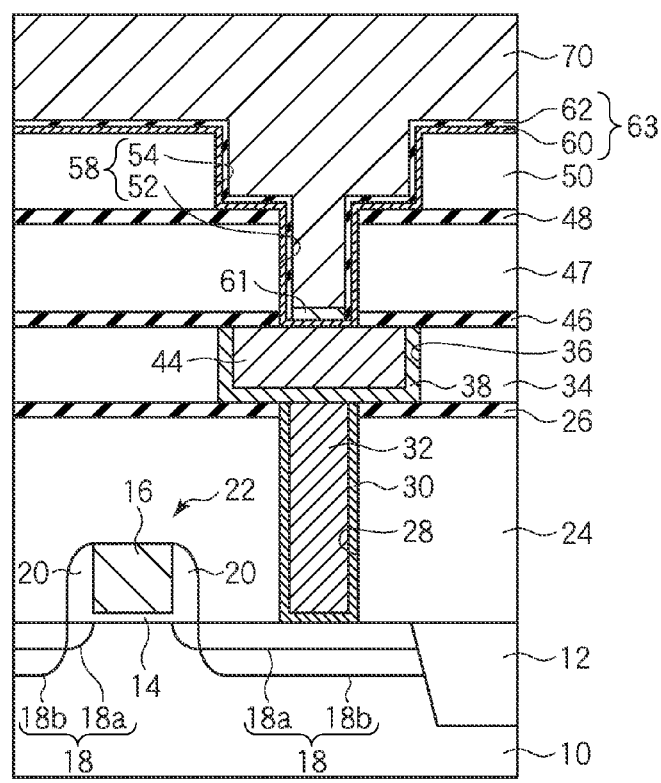
Figure 9:
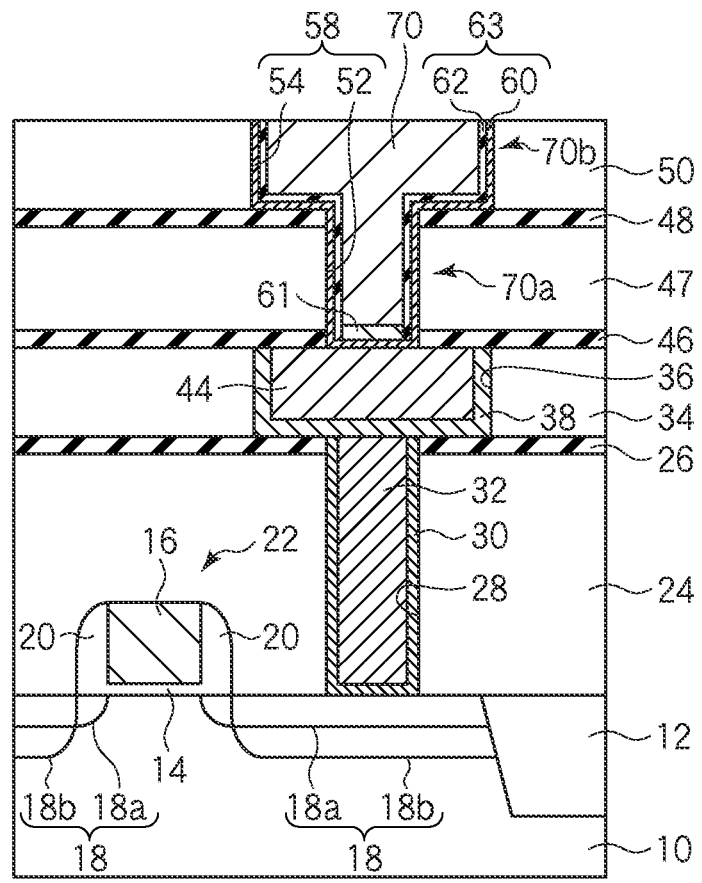

Next, as illustrated in FIG. 8A, the Cu film 70 is formed on the entire surface by electroplating using, e.g., a copper sulfate bath. In forming the Cu film 70, the CuMn film 61 functions as the seed film, which makes it unnecessary to form a seed film separately from the CuMn film 61. The film thickness of the Cu film 70 is, e.g., about 1 μm.

Then, thermal processing is made. The thermal processing temperature is, e.g., about 200° C. The thermal processing period of time is, e.g., about 120 seconds. The thermal processing causes oxygen to be emitted from the inter-layer insulation films 47, 50, etc. The oxygen which has been emitted from the inter-layer insulation films 47, 50, etc. passes through the grain boundaries of the $ZrB_2$ film 60, which is a polycrystalline film, and arrives at the CuMn film 61. Thus, the oxygen emitted from the inter-layer insulation films 47, 50, etc. reacts with the Mn atoms in the CuMn film 61, and the $MnO_x$ film 62 is formed (see FIG. 8B). That is, the $MnO_x$ film 62 is self-formed. The $MnO_x$ film 62 is formed on the side walls of the contact holes 52 with the $ZrB_2$ film 60 formed on and on the side surfaces and the bottom surfaces of the trenches 54 with the $ZrB_2$ film 60 formed on. The film thickness of the $MnO_x$ film 62 is, e.g., about 1-5 nm. On the bottoms of the contact holes 52, the oxygen is not supplied to the CuMn film 61, and the MnOx film 62 is not formed. Accordingly, on the bottoms of the contact holes 52, the CuMn film 61 remains on the $ZrB_2$ film 60.

Such thermal processing is made in one independent process here but may not be made in one independent process. That is, the thermal processing is made not on this stage but in a later step where heating is made in forming insulation films, etc. whereby the $MnO_x$ film 62 can be formed. The $MnO_x$ film 62 can be formed by another thermal processing in a later step. Thus, the thermal processing may not be formed on this stage as one independent step.

Next, the Cu film 70, the $MnO_x$ film 62 and the $ZrB_2$ film 60 are polished by, e.g., CMP until the surface of the inter-layer insulation film 50 is exposed.

Thus, by dual damascene process, the conductor plugs 70a of Cu and the interconnections 70b of Cu are buried respectively in the contact holes 52 and in the trenches 54. That is, the conductor plugs 70a, and the interconnections 70b formed integral with the conductor plugs 70a are buried in the openings 58 (see FIG. 9).

Then, multilayer interconnections, electrode pads, etc. not illustrated are further formed.

Thus, the semiconductor device according to the present embodiment is manufactured.

As described above, according to the present embodiment, the base film 63 is formed of the $ZrB_2$ film 60 which can ensure sufficient adhesion even with the film thickness set small and the $MnO_x$ film 62 which can sufficiently prevent the diffusion of Cu even with the film thickness set small. According to the present embodiment, the film thickness of the base film 63 can be set extremely small without deteriorating the adhesion and barrier ability, which allows the conductor plugs and the interconnections to be micronized without deteriorating the reliability.

According to the present embodiment, the $ZrB_2$ film 60, which is polycrystalline film, permits the oxygen emitted from the inter-layer insulation films 47, 50, etc. to easily arrive the CuMn film 61 through the grain boundaries of the $ZrB_2$ film 60. Thus, according to the present embodiment, the oxygen emitted from the inter-layer insulation films 47, 50, etc. can be reacted with the Mn in the CuMn film 61 without failure, and the $MnO_x$ film 62 can be formed without failure. According to the present embodiment, the $MnO_x$ film 62 which prevents the diffusion of Cu can be formed without failure, which sufficiently ensures the reliability and the manufacturing yield.

According to the present embodiment, the CuMn film 61 functions as the seed film for forming the Cu film 70 by electroplating, which makes it unnecessary to form the seed film separate from the CuMn film 61. Accordingly, the Cu film 70 is formed by electroplating with sufficiently large openings formed in the contact holes 52, which allows the plating solution to be sufficiently supplied into the contact holes 52. Thus, according to the present embodiment, the reliability and the manufacturing yield can be sufficiently ensured.

(Modification 1)

Figure 10:
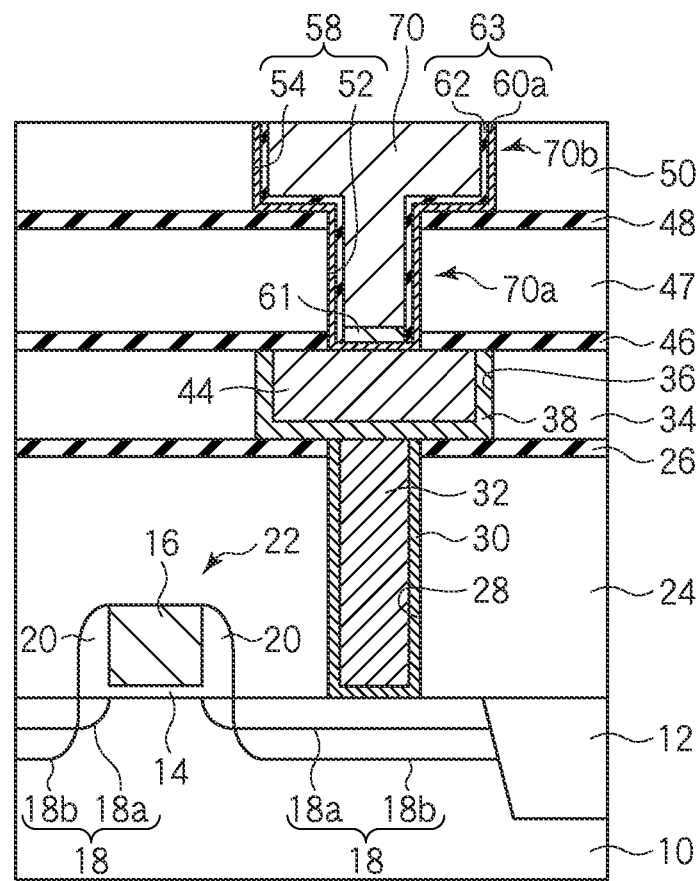
FIG. 10 is a cross sectional view of a semiconductor device according to a first modification of the first embodiment.

Next, the semiconductor device and its manufacturing method according to Modification 1 of the present embodiment will be explained with reference to FIGS. 10 to 13B. FIG. 10 is a cross sectional view of the semiconductor device according to the present modification.

The semiconductor device according to the present modification is characterized in that the first film 60a is formed of ZrBN film.

As illustrated in FIG. 10, the first film (adhesion film) 60a of a compound containing Zr is formed in the openings 58. The first film 60a is formed of ZrBN film. The ZrBN 60a is formed on the side surfaces and the bottom surfaces of the contact holes 52 and on the side surfaces and the bottoms surfaces of the trenches 54. The ZrBN film 60a is an amorphous conduction film. The ZrBN film 60a contains no carbon. The ZrBN film 60a is formed in a substantially uniform film thickness. The film thickness of the ZrBN film 60a is, e.g., 1-10 nm. More preferably, the film thickness of the ZrBN film 60 is 1-5 nm.

In the present embodiment, the first film 60a is formed of ZrBN film for the following reasons.

That is, ZrBN film 60a contains Zr, as does $ZrB_2$ film, and is suitable to ensure the adhesion of the conductor plugs 70a and the interconnections 70b of Cu to the bases.

The ZrBN film 60a cam be formed by CVD, as is $ZrB_2$ film, and can be formed in a substantially uniform film thickness. Furthermore, ZrBN film 60a can ensure sufficient adhesion even when formed thin. The film thickness of the first film 60a can be set small, which allows the film thickness of the base film 63 to be set small. Thus, the first film 60a is formed of ZrBN film, whereby the diameter of the conductor plugs 70a and the width of the interconnections 70b can be made sufficiently large even when the diameter of the contact holes 52 and the width of the trenches 54 are small.

The ZrBN film 60 can be formed of an inorganic raw material, and it is possible to form the ZrBN film 60 containing no carbon. The ZrBn film formed of an inorganic raw material contains no carbon, and its specific resistance value is extremely small. Accordingly, the first film 60a is formed of ZrBN film containing no carbon, whereby the contact resistance between the conductor plugs 70a and the interconnections 44 can be made sufficiently low.

For these reasons, in the present modification, the first film 60a is formed of ZrBN film.

The ZrBN film 60a is an amorphous conduction film, but some of the oxygen emitted from the inter-layer insulation films 47, 50, etc. passes through the ZrBN film 60a. Accordingly, even when the first film 60a is formed of ZrBN film, the CuMn film 61 can be changed into the $MnO_x$ film 62.

In the openings 58 with the ZrMn film 60a formed in, the second film (barrier film) 62 of an oxide containing Mn is formed. The second film 62 is formed of $MnO_x$ film here. The second film 62 is formed on the side surfaces of the contact holes 52 with the ZrBN film 60a formed on and on the side surfaces and the bottom surfaces of the trenches 54 with the ZrBN film 60a formed on. The film thickness of the second film 62 is about 2-5 nm. The second film 62 formed of $MnO_x$ functions as the barrier film for preventing the diffusion of Cu.

On the first film 60a on the bottoms of the contact holes 52, the conduction film 61 of CuMn is formed. The film thickness of the conduction film 61 is, e.g., about 1-5 nm.

In the openings 58 with the base film 63 and the conduction film 61 formed in, the conductor 70 of Cu or a Cu alloy are buried. That is, the conductors 70 including the conductor plugs 70a and the interconnections 70b formed integral with the conductor plugs 70a are buried in the openings 58.

On the inter-layer insulation film 50 with the conductor plugs 70a and the interconnections 70b buried in, interconnections not illustrated are further formed.

Thus, the semiconductor device according to the present modification is constituted.

As described above, in the present modification, the base film 63 is formed of the ZrBN film 60a which can sufficiently ensure the adhesion even when the film thickness is set small, and the $MnO_x$ film 62 which can sufficiently prevent the diffusion of Cu even when the film thickness is set small. By the present modification as well, the film thickness of the base film 63 can be set extremely small without deteriorating the adhesion and the barrier ability, whereby the conductor plugs and the interconnections can be micronized without deteriorating the reliability.

Next, the method for manufacturing the semiconductor device according to the present modification will be explained with reference to FIGS. 11A to 13B. FIGS. 11A to 13B are cross sectional views of the semiconductor device according to the present modification in the steps of the manufacturing method, which illustrate the method.

Figure 11A:
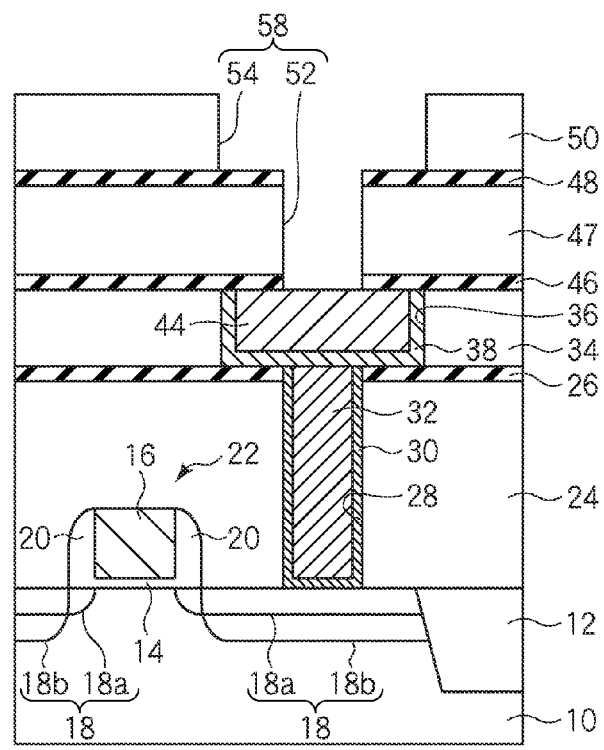
FIGS. 11A to 13B are cross sectional views of the semiconductor device according to the first modification of the first embodiment in the steps of the method for manufacturing the semiconductor device, which illustrate method.

The step of forming the device isolation regions 12 in the semiconductor substrate 10 to the step of forming the openings 58 in the inter-layer insulation films 47, 50 are substantially the same as those of the semiconductor device manufacturing method described above with reference to FIGS. 2A to 6B, and their explanation is not repeated (see FIG. 11A).

Figure 11B:
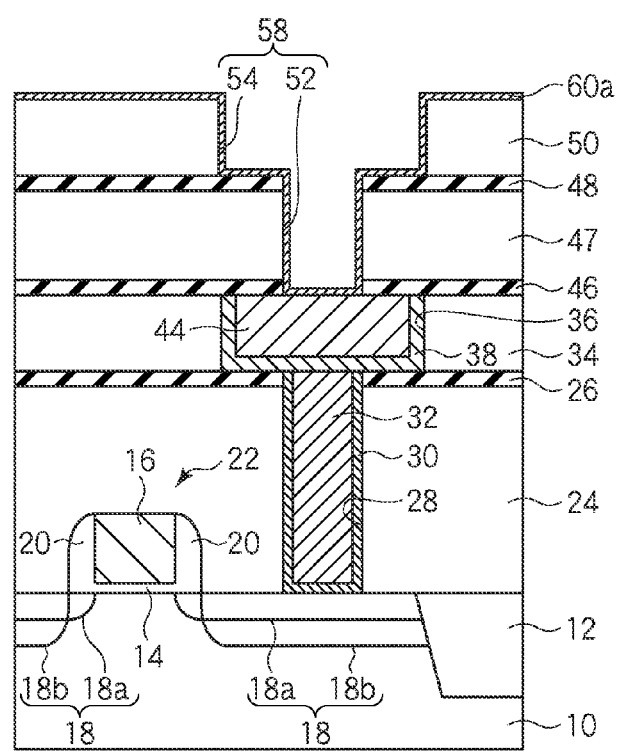

Next, as illustrated in FIG. 11B, the ZrBN film 60a is formed on the entire surface by, e.g., remote plasma CVD. The film thickness of the ZrBN film 60a is, e.g., 1-10 nm. More preferably, the film thickness of the ZrBN film 60a is 1-5 nm. As the raw material for forming the ZrBN film 60a, $Zr(BH_4)_4$, which is an inorganic raw material, is used. The film forming conditions for the ZrBN film 60a are as exemplified below. The carrier gas is, e.g., Ar gas. As the gases for generating plasmas, $NH_3$ gas and $H_2$ gas, for example, are used. The substrate temperature is, e.g., 180-300° C. The pressure in the film forming chamber is, e.g., about 150 Pa.

In the present modification, the ZrBN film 60a is formed of $Zr(BH_4)_4$, which is an inorganic raw material, for the following reasons.

That is, the ZrBN film formed by using $Zr[N(C_2H_5)_2]_4$, which is an organic raw material, contains carbon therein, and the specific resistance is relatively large, while the ZrBN film 60a formed by using $Zr(BH_4)_4$, which is an inorganic raw material, contains no carbon therein, and the relative resistance is extremely small. Accordingly, the ZrBN film 60 is formed by using $Zr(BH_4)_4$, which is an inorganic raw material, whereby the contact resistance between the conductor plugs 70a and the interconnections 44 can be made sufficiently low.

The vapor pressure of $Zr[N(C_2H_5)_2]_4$, which is an organic raw material, is 0.1 Torr at 120° C., while the vapor pressure of $Zr(BH_4)_4$, which is an inorganic raw material, is 17 Torr at 25° C. That is, $Zr(BH_4)_4$, the vapor pressure of which is relatively high, residue of the raw material does not easily adhere to the reactors and the pipes, and is relatively easy to treat.

For such reasons, in the present modification, the ZrBN film 60a is formed by using $Zr(BH_4)_4$, which is an inorganic raw material.

Figure 12A:
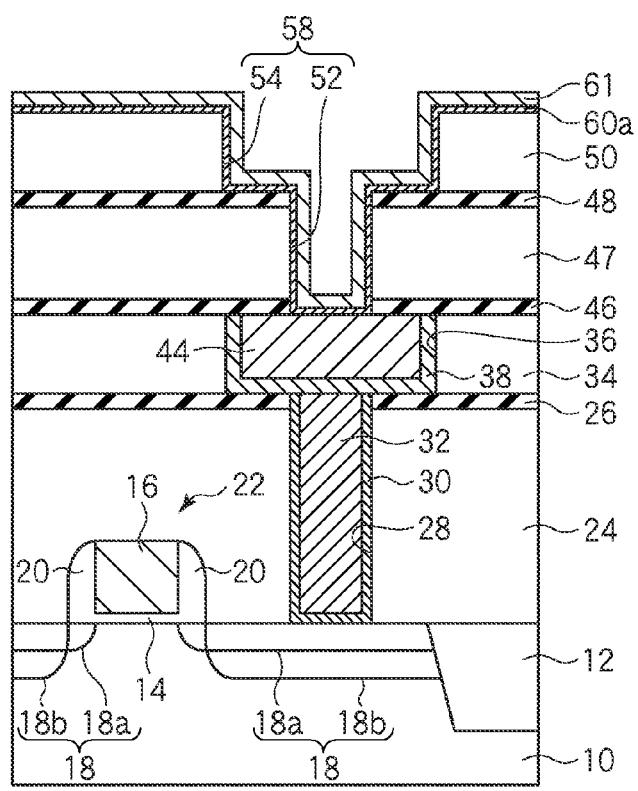

Then, as illustrated in FIG. 12A, the CuMn film 61 is formed on the entire surface by, e.g., physical vapor deposition. More specifically, the CuMn film 61 is formed by, e.g., sputtering. The film thickness of the CuMn film 61 is, e.g., 2-40 nm. As the target used in forming the CuMn film 61, a target of CuMn of a 0.1-30 atom % Mn concentration is used. When the CuMn film 61 is formed by using such target, the concentration of Mn in the CuMn film 61 is, e.g., 0.1-10 atom %.

Figure 12B:
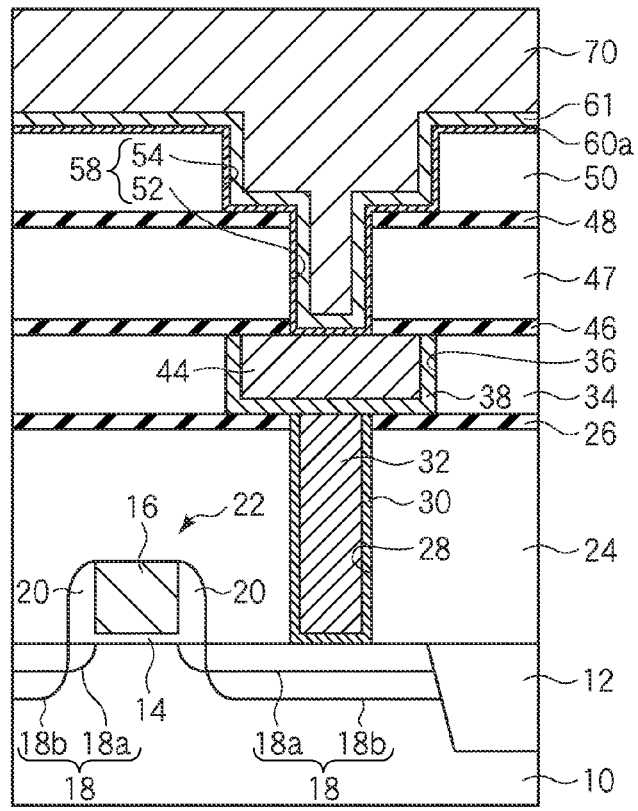
Figure 13A:
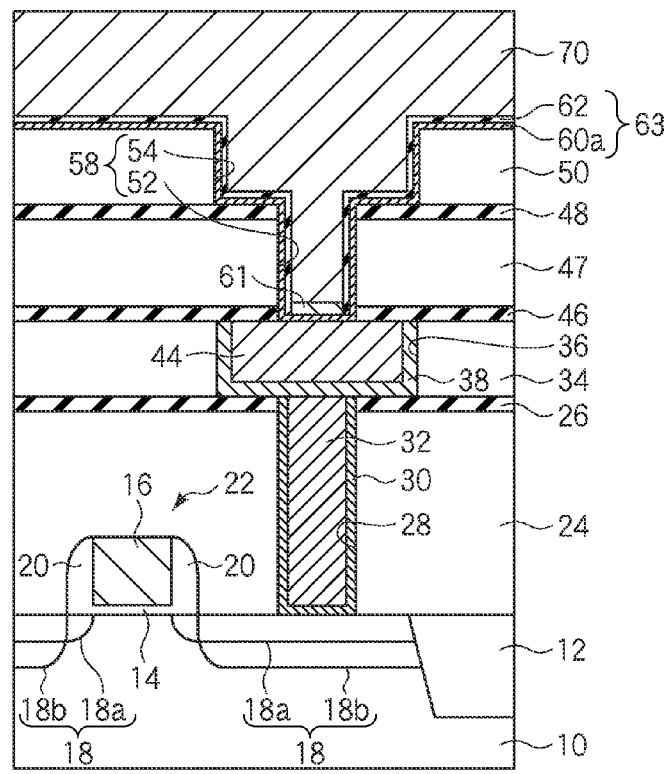
Figure 13B:
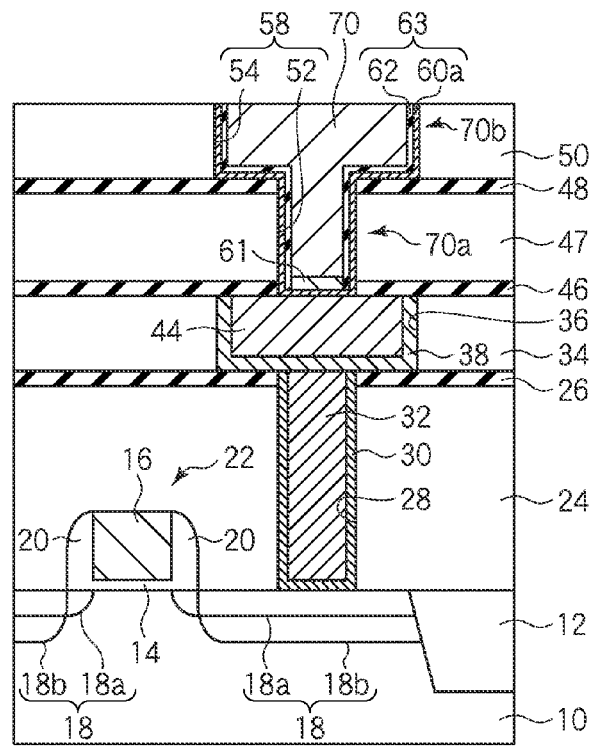

Next, as illustrated in FIG. 12B, the Cu film 70 is formed on the entire surface by electroplating using, e.g., a copper sulfate bath. In forming the Cu film 70, the CuMn film 61 functions as the seed film. Accordingly, it is not necessary to form a seed film separate forming the CuMn film 61.

Next, thermal processing is made. The thermal processing temperature is, e.g., about 400° C. The thermal processing period of time is about 300 seconds. When the thermal processing is made, oxygen is emitted from the inter-layer insulation films 47, 50, etc. The ZrBN film 60a, which is an amorphous film, does not perfectly block the passage of oxygen. Accordingly, the oxygen emitted from the inter-layer insulation films 47, 50, etc. passes through the ZrBN film 60a and reaches the CuMn film 61. Thus, the oxygen emitted from the inter-layer insulation films 47, 50, etc. react with the Mn atoms in the CuMn film 61, and the $MnO_x$ film 62 is formed (see FIG. 13A). The $MnO_x$ film 62 is formed on the side surfaces of the contact holes 52 with the ZrBN film 60a formed on and on the side surfaces and the bottom surfaces of the trenches 54 with the ZrBN film 60a formed on. The film thickness of the $MnO_x$ film 62 is, e.g., about 2-5 nm. At the bottoms of the contact holes 52, the oxygen is not supplied to the CuMn film 61, and the $MnO_x$ film 62 is not formed. Accordingly, on the bottoms of the contact holes 52, the CuMn film 61 remains on the ZrBN film 60a.

The thermal processing is made as one independent step here but may not be made as one independent step. That is, the thermal processing is not made on this stage, but heating is made in a later step of forming the insulation film, etc., whereby the $MnO_x$ film 62 can be formed. The $MnO_x$ film 62 can be formed by another thermal processing made in a later step. The thermal processing may not be made on this stage as one independent step.

Then, the Cu film 70, the $MnO_x$ film 62 and the ZrBN film 60a are polished by, e.g., CMP until the surface of the inter-layer insulation film 50 is exposed.

Thus, the conductor plugs 70a of Cu and the interconnections 70b of Cu are buried by dual damascene process respectively in the contact holes 52 and in the trenches 54. That is, the conductors 70 including the conductor plugs 70a, and the interconnections 70b formed integral with the conductor plugs 70a are buried in the openings 58 (see FIG. 13B).

Then, multi-layer interconnections, electrode pads, etc. not illustrated are further formed.

Thus, the semiconductor device according to the present modification is manufactured.

As described above, the first film 60a may be formed of ZrBN film.

(Modification 2)

Figure 14:
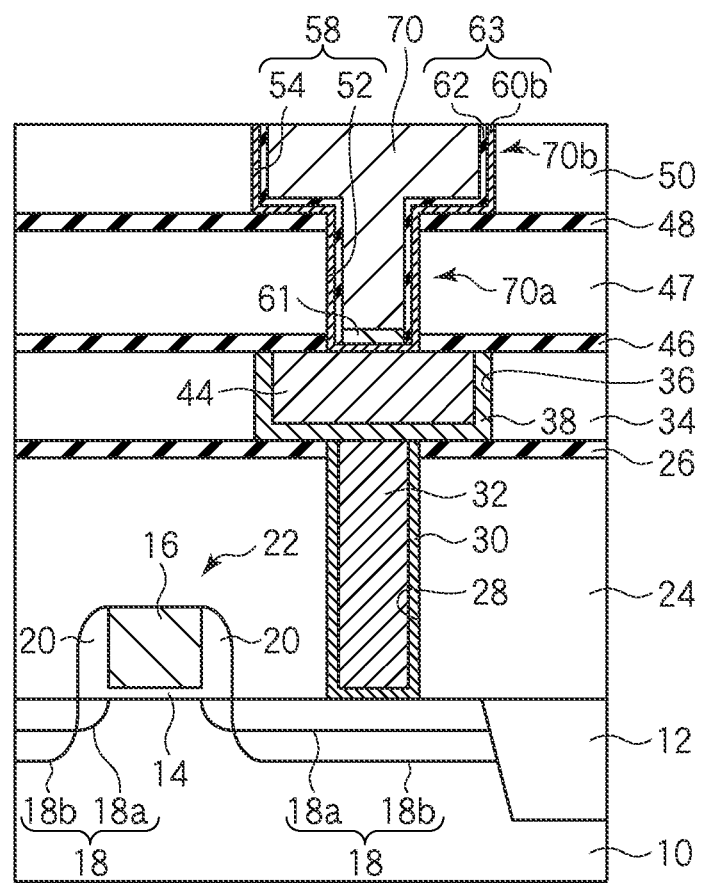
FIG. 14 is a cross sectional view of a semiconductor device according to a second modification of the first embodiment.

Next, the semiconductor device and its manufacturing method according to Modification 2 of the present embodiment will be explained with reference to FIGS. 14 to 17B. FIG. 14 is a cross sectional view of the semiconductor device according to the present modification.

The semiconductor device according to the present modification is characterized in that the first film 60b is formed of ZrN film.

As illustrated in FIG. 14, the first film (adhesion film) 60a of a compound containing Zr is formed in the openings 58. The first film 60b is formed of ZrN film. The ZrN film 60b is formed on the side surfaces and the bottom surfaces of the contact holes 52 and on the side surfaces and the bottoms surfaces of the trenches 54. The ZrN film 60b is an amorphous conduction film. The ZrN film 60b contains no carbon. The ZrN film 60b is formed in a substantially uniform film thickness. The film thickness of the ZrN film 60b is, e.g., 1-10 nm. More preferably, the film thickness of ZrN film 60b is 1-5 nm.

In the present modification, the first film 60b is formed of ZrN film for the following reasons.

That is, the ZrN film 60b, which contains Zr as does the $ZrB_2$ film, is suitable to ensure the adhesion of the conductor plugs 70a and the interconnections 70b of Cu to the bases.

The ZrN film 60b can be formed by CVD, as can the $ZrB_2$ film, and can be formed thin and uniform. The first film 60b can ensure sufficient adhesion even when formed thin. The film thickness of the first film 60b can be set small, whereby the film thickness of the base film 63 can be set small. Accordingly, the first film 60b is formed of ZrN film, whereby even when the diameter of the contact holes 52 and the width of the trenches 54 are small, the diameter of the conductor plugs 70a and the width of the interconnections 70b can be sufficiently large.

The ZrN film 60b can be formed of an inorganic raw material, and it is possible to form the ZrN 60b contains no carbon. The ZrN film formed of an inorganic raw material contains no carbon, and has an extremely small specific resistance. Thus, the first film 60b is formed of ZrN film containing no carbon, whereby the contact resistance between the conductor plugs 70a and the interconnections 44 can be made sufficiently low.

For such reasons, in the present modification, the first film 60b is formed of ZrN film.

The ZrN film 60b is an amorphous conduction film, but some of the oxygen emitted from the inter-layer insulation films 47, 50, etc. passes through the ZrN film 60b. Accordingly, even when the first film 60b is formed of ZrN film, the CuMn film 61 can be changed into the $MnO_x$ film 62.

In the openings 58 with the ZrN film 60b formed in, the second film (barrier film) 62 of an oxide containing Mn is formed. The second film 62 is formed of $MnO_x$ film here. The second film 62 is formed on the side surfaces of the contact holes 52 with the ZrN film 60b formed on, and on the side surfaces and the bottom surfaces of the trenches 54 with the ZrN film 60b formed on. The film thickness of the second film 62 is, e.g., about 2-5 nm. The second film 62 of $MnO_x$ functions as the barrier film for preventing the diffusion of Cu.

On the first film 60 on the bottoms of the contact holes 52, the conduction film 61 of CuMn is formed. The film thickness of such conduction film 61 is, e.g., about 1-5 nm.

In the openings 58 with the base film 63 and the conduction film 61 formed in, the conductors 70 of Cu or a Cu alloy are buried. That is, the conductors 70 including the conductor plugs 70a, and the interconnections 70b formed integral with the conductor plugs 70a are buried in the openings 58.

On the inter-layer insulation film 50 with the conductor plugs 70a and the interconnections 70b buried in, interconnections not illustrated are further formed.

Thus, the semiconductor device according to the present modification is constituted.

As described above, in the present modification, the base film 63 is formed of the ZrN film 60b which can sufficiently ensure the adhesion even when the film thickness is set small, and the $MnO_x$ film 62 which can sufficiently prevent the diffusion of Cu even when the film thickness is set small. In the present modification as well, the film thickness of the base film 63 can be set extremely small without deteriorating the adhesion and the barrier ability, whereby the conductor plugs and interconnections can be micronized without deteriorating the reliability.

Next, the method for manufacturing the semiconductor device according to the present modification will be explained with reference to FIGS. 15A to 17B. FIGS. 15A to 17B are cross sectional views of the semiconductor device according to the present modification in the steps of the method for manufacturing the semiconductor device, which describe the method.

Figure 15A:
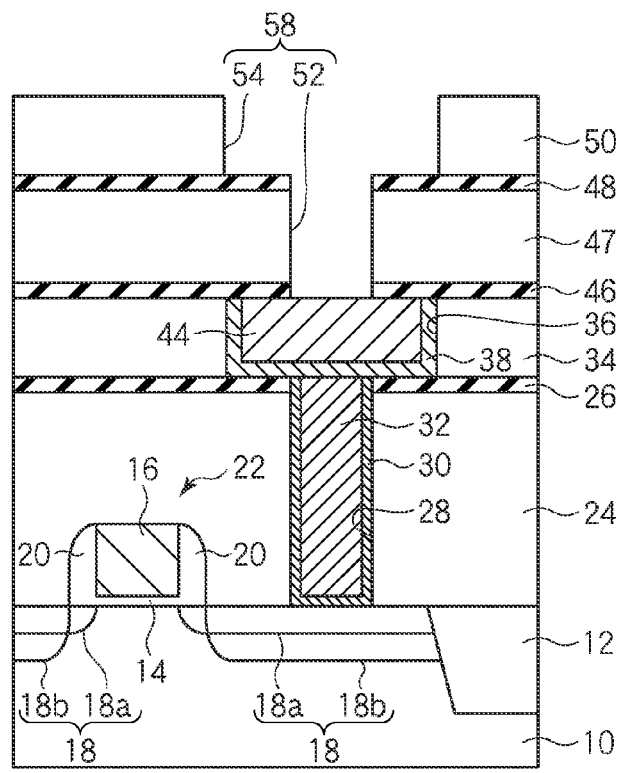
FIGS. 15A to 17B are cross sectional views of the semiconductor device according to the second modification of the first embodiment in the steps of the method for manufacturing the semiconductor device, which illustrate method.

First, the step of forming the device isolation regions 12 in the semiconductor substrate 10 to the step of forming the openings 58 in the inter-layer insulation films 47, 50 are substantially the same as the steps of the semiconductor device manufacturing method described above with reference to FIGS. 2A to 6B, and their explanation will not be repeated (see FIG. 15A).

Figure 15B:
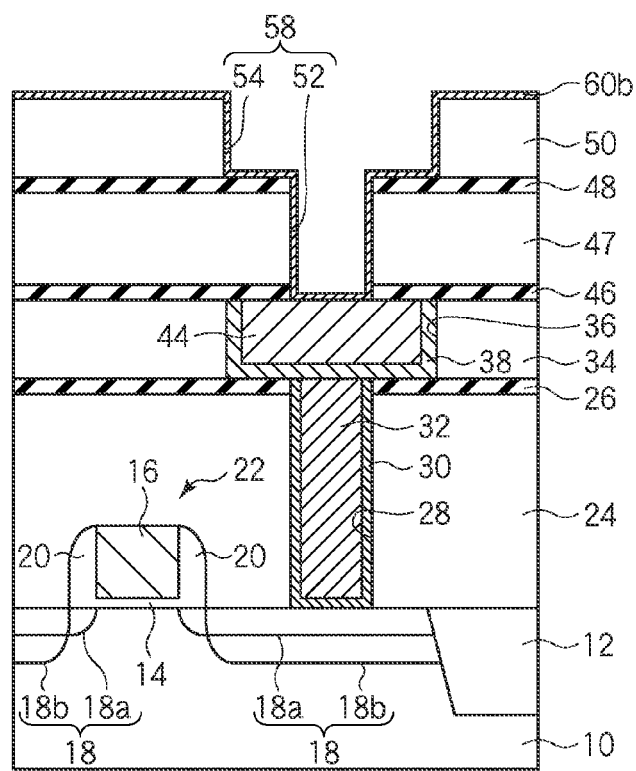

Next, as illustrated in FIG. 15B, the ZrN film 60b is formed on the entire surface by, e.g., CVD. The film thickness of the ZrN film 60b is, e.g., 1-10 nm. More preferably, the film thickness of the ZrN film 60a is 1-5 nm. As the raw material for forming the ZrN film 60b, $Zr[N(C_2H_5)_2]_4$, for example, is used. The film forming conditions for the ZrN film 60b are as exemplified below. The set temperature of the bubbler is, e.g., 50° C. The carrier gas is, e.g., He gas. The flow rate of the He gas is, e.g., 200 sccm. The substrate temperature is, e.g., 200-250° C. The pressure in the film forming chamber is, e.g., about 1000 Pa.

Figure 16A:
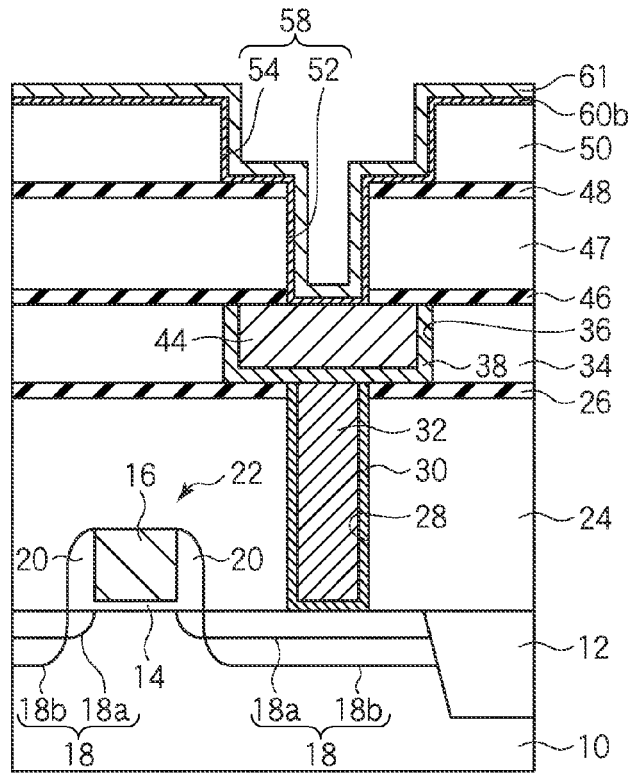

Then, as illustrated in FIG. 16A, the CuMn film 61 is formed on the entire surface by, e.g., physical vapor deposition. More specifically, the CuMn film 61 formed by, e.g., sputtering. The film thickness of the CuMn film 61 is, e.g., 10-40 nm. As the target for forming the CuMn film 61, a target of CuMn of a 0.1-30 atom % Mn concentration is used. The CuMn film 61 formed by using such target has, e.g., a 0.1-10 atom % Mn concentration.

Figure 16B:
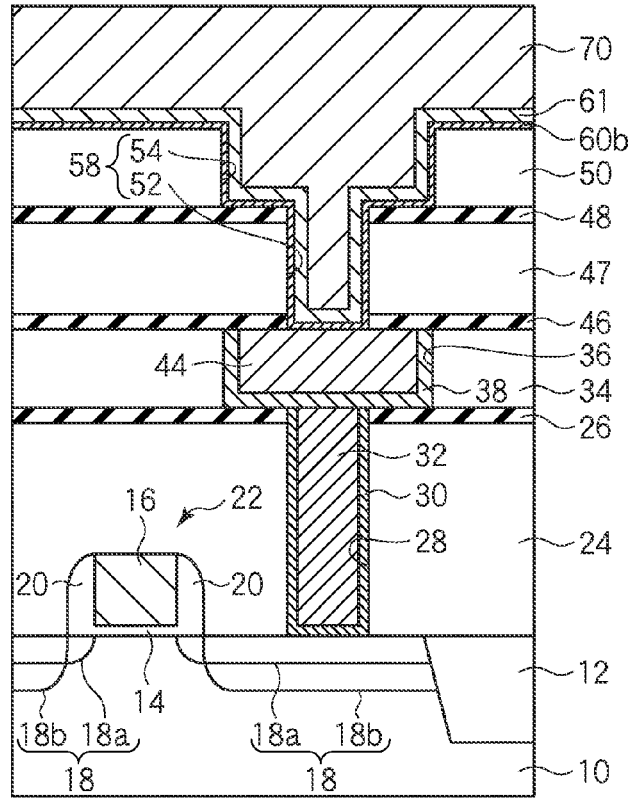
Figure 17A:
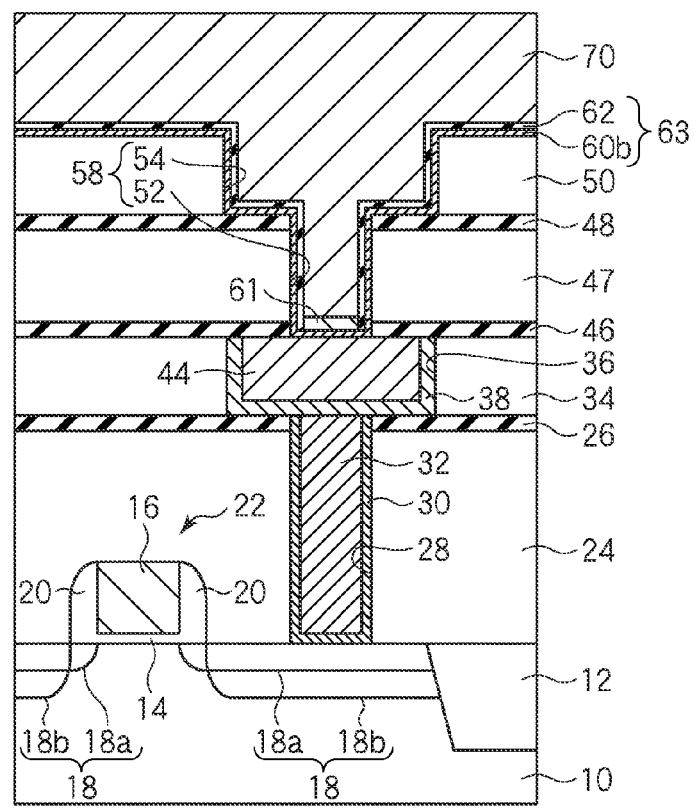
Figure 17B:
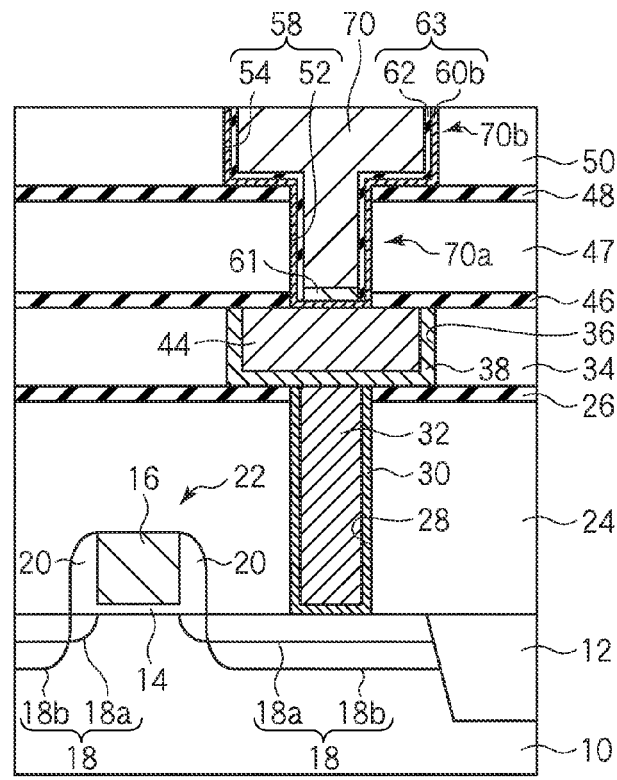

Next, as illustrated in FIG. 16B, the Cu film 70 is formed on the entire surface by electroplating using, e.g., a copper sulfate bath. In forming the Cu film 70, the CuMn film 61 functions as the seed film. Accordingly, in the present modification, it is not necessary to form a seed film separate from the CuMn film 61.

Next, thermal processing is made. The thermal processing temperature is, e.g., about 400° C. The thermal processing period of time is, e.g., about 300 seconds. By the thermal processing, oxygen is emitted from the inter-layer insulation films 47, 50, etc. The ZrN film 60b is an amorphous film but does not perfectly block the passage of oxygen. Accordingly, oxygen emitted from the inter-layer insulation films 47, 50, etc. passes through the ZrN film 60b and reaches the CuMn film 61. Thus, the oxygen emitted from the inter-layer insulation films 47, 50, etc. reacts with the Mn atoms in the CuMn film 61, and the $MnO_x$ film 62 is formed (see FIG. 17A). The $MnO_x$ film 62 is formed on the side surfaces of the contact holes 52 with the ZrN film 60b formed on and on the side surfaces and the bottom surfaces of the trenches 54 with the ZrN film 60b formed on. The film thickness of the $MnO_x$ film 62 is, e.g., about 1-5 nm. At the bottoms of the contact holes 52, oxygen is not supplied to the CuMn film 61, and the $MnO_x$ film 62 is not formed. Accordingly, at the bottoms of the contact holes 52, the CuMn film 61 remains on the ZrN film 60b.

The thermal processing is made as one independent step here but may not be made as one independent step. That is, the thermal processing is not be made on this stage but is made in a later step for forming the insulation film, etc., and the $MnO_x$ film 62 can be formed. The $MnO_x$ film 62 can be formed by another thermal processing to be made in a later step. Thus, the thermal processing may not be made in one independent step on this stage.

Next, the Cu film 70, the $MnO_x$ film 62 and the ZrN film 60b are polished by, e.g., CMP until the surface of the inter-layer insulation film 50 is exposed.

Thus, the conductor plugs 70a of Cu and the interconnections 70b of Cu are buried by dual damascene process respectively in the contact holes 52 and in the trenches 54. That is, the conductors 70 including the conductor plugs 70a, and the interconnections 70b formed integral with the conductor plugs 70a are buried in the openings 58 (see FIG. 17B).

Then, multilayer interconnections, electrode pads, etc. not illustrated are further formed.

Thus, the semiconductor device according to the present modification is manufactured.

As described above, the first film 60b may be formed on ZrN film.

Second Embodiment

The semiconductor device according to a second embodiment and its manufacturing method will be described with reference to FIGS. 18 to 21B. The same members of the present embodiment as those of the semiconductor device according to the first embodiment and its manufacturing method illustrated in FIGS. 1 to 17B are represented by the same reference numbers not to repeat or to simplify their explanation.

The semiconductor device and its manufacturing method according to the present embodiment are characterized mainly in that the first film 60 is removed from the bottoms of the contact holes 52.

(Semiconductor Device)

Figure 18:
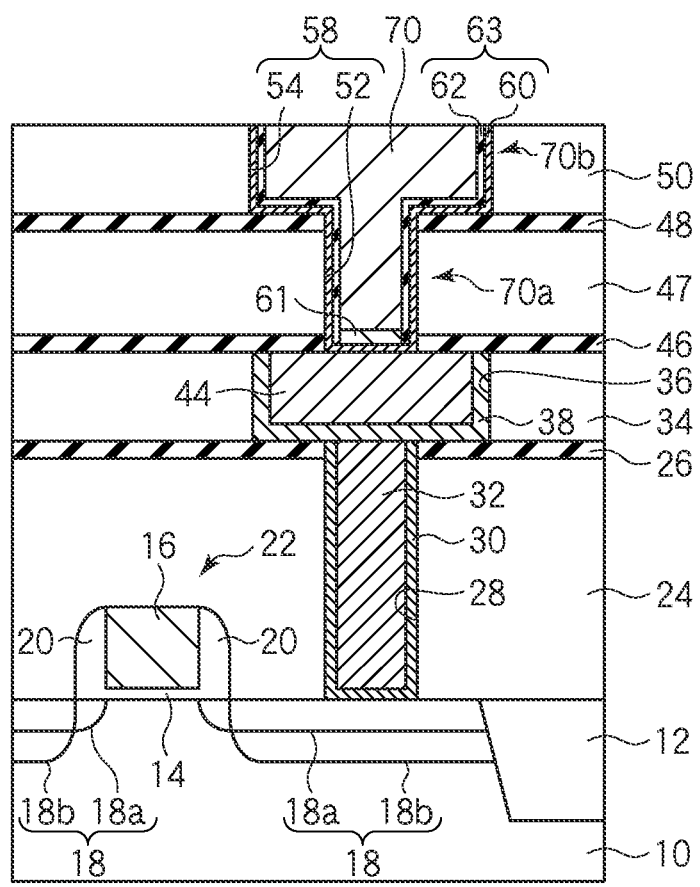
FIG. 18 is a cross sectional view of a semiconductor device according to a second embodiment.

First, the semiconductor device according to the present embodiment will be described with reference to FIG. 18. FIG. 18 is a cross sectional view of the semiconductor device according to the present embodiment.

As illustrated in FIG. 18, a first film (adhesion film) 60 of a compound containing Zr is formed in the openings 58. The first film 60 is formed of $ZrB_2$ film. The $ZrB_2$ film 60 is formed on the side surfaces of the contact holes 52 and on the side surfaces and the bottom surfaces of the trenches 54. On the bottoms of the contact holes 52, the $ZrB_2$ film 60 is removed. In the present embodiment, the $ZrB_2$ film 60 is removed from the bottoms of the contact holes 52 so as to reduce the contact resistance between the conductor plugs 70a and the interconnections 44.

In the openings 58 with the $ZrB_2$ film 60 formed in, the second film (barrier film) 62 of an oxide containing Mn is formed. The second film 62 is formed of $MnO_x$ film here. The second film 62 is formed on the side surfaces of the contact holes 52 with the $ZrB_2$ film 60 formed in and on the side surfaces and the bottom surfaces of the trenches 54 with the $ZrB_2$ film 60 formed in.

The $ZrB_2$ film 60 and the $MnO_x$ film 62 form the base film 63.

On the interconnections 44 at the bottoms of the contact holes 52, the conduction film 61 of CuMn is formed.

The conductors 70 of Cu or a Cu alloy are buried in the openings 58 with the base film 63 and the conduction film 61 formed in. That is, the conductors 70 including the conductor plugs 70a, and the interconnections 70b formed integral with the conductor plugs 70a are buried in the openings 58.

On the inter-layer insulation film 50 with the conductor plugs 70a and the interconnections 70b buried in, interconnections not illustrated are further formed.

Thus, the semiconductor device according to the present embodiment is constituted.

The semiconductor device according to the present embodiment is characterized mainly in that the first film 60 of $ZrB_2$ is removed from the bottoms of the contact holes 52. In the present embodiment, with the $ZrB_2$ film 60 being removed from the bottoms of the contact holes 52, the CuMn film 61 alone is present between the conductor plugs 70a and the interconnections 44. Thus, according to the present embodiment, the contact resistance between the conductor plugs 70a and the interconnections 44 can be reduced in comparison with the contact resistance with the $ZrB_2$ film 60 and the CuMn film 61 being present on the bottoms of the contact holes 52.

(Method for Manufacturing the Semiconductor Device)

Next, the method for manufacturing the semiconductor device according to the present embodiment will be described with reference to FIGS. 19A to 21B. FIGS. 19A to 21B are cross sectional views of the semiconductor device in the steps of the method for manufacturing the semiconductor device, which describe the manufacturing method.

Figure 19A:
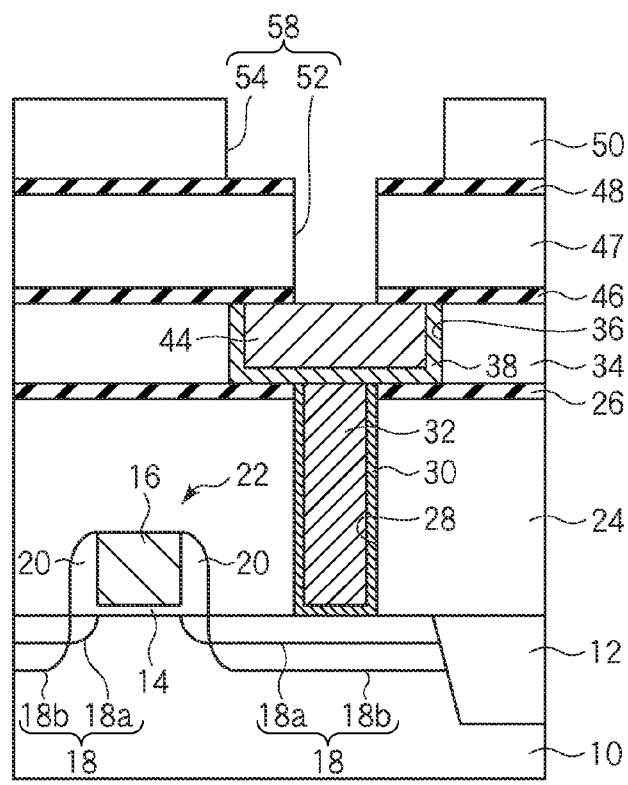
FIGS. 19A to 21B are cross sectional views of the semiconductor device according to the second embodiment in the steps of the method for manufacturing the semiconductor device, which illustrate method.

First, the step of forming the device isolation regions 12 in the semiconductor substrate 10 to the step of forming the openings 58 in the inter-layer insulation films 47, 50 are substantially the same as those of the method for manufacturing the semiconductor device according to the first embodiment described above with reference to FIGS. 2A to 6B, and their explanation will not be repeated (see FIG. 19A).

Figure 19B:
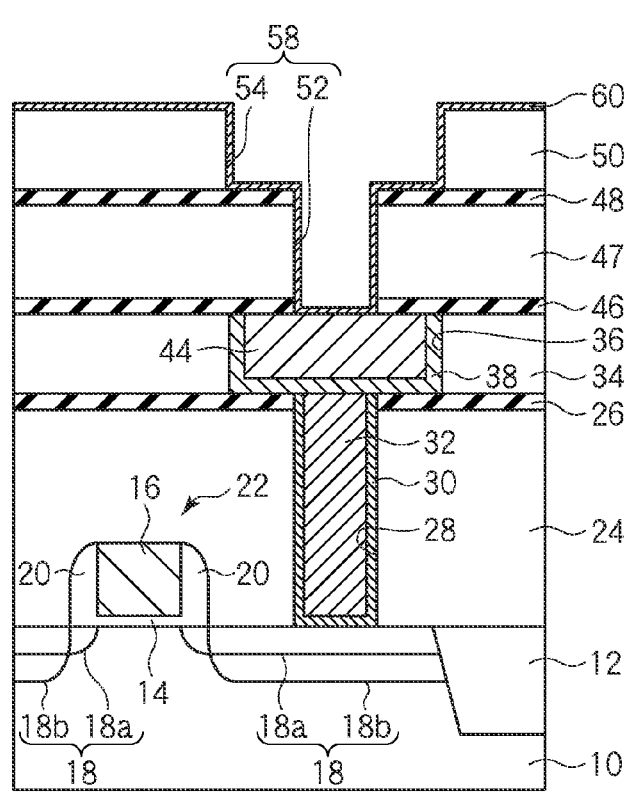

Next, in substantially the same way as in the method for manufacturing the semiconductor device according to the first embodiment described above with reference to FIG. 7A, the $ZrB_2$ film 60 is formed on the entire surface by, e.g., CVD (see FIG. 19B).

Figure 20A:
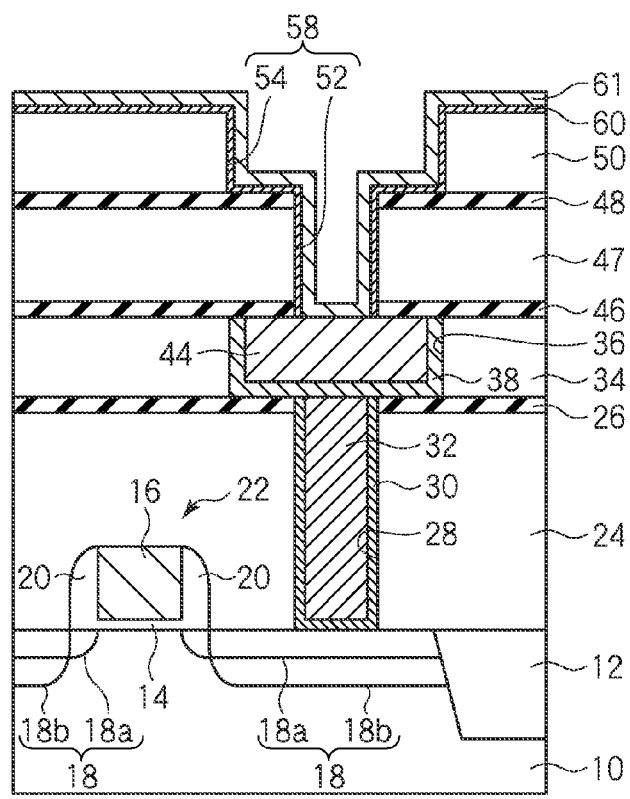

Next, as illustrated in FIG. 20A, the CuMn film 61 is formed on the entire surface by, e.g., physical vapor deposition. More specifically, the CuMn film 61 is formed by, e.g., sputtering. The film thickness of the CuMn film 61 is, e.g., 10-40 nm. As the target for forming the CuMn film 61, a target of CuMn of a 0.1-30 atom % Mn concentration is used. The CuMn film 61 formed by using such target has an Mn concentration of, e.g., 0.1-10 atom %.

The CuMn film 61 is formed under the conditions for forming the CuMn film 61 on the entire surface while the $ZrB_2$ film 60 present on the bottoms of the contact holes 52 are being selectively removed by Cu ions or Mn ions. The film forming conditions for the CuMn film 61 are as exemplified below. The target electric power is, e.g., about 1-100 kW. The substrate bias is, e.g., about 1-100 W. By forming the CuMn film 61 under such conditions, the CuMn film 61 can be formed on the entire surface while the $ZrB_2$ film 60 present on the bottoms of the contact holes 52 is being selectively removed by Cu ions or Mn ions. The $ZrB_2$ film 60 on the bottoms of the contact holes 52 is removed, and good contact can be obtained. Because of the width of the trenches 54 which are sufficiently large for the diameter of the contact holes 52, the $ZrB_2$ film present on the bottoms of the trenches 54 is not substantially etched by the Cu ions or Mn ions when the CuMn film 61 is formed. Thus, the $ZrB_2$ film 60 on the bottoms of the trenches 54 is never extinguished.

Figure 20B:
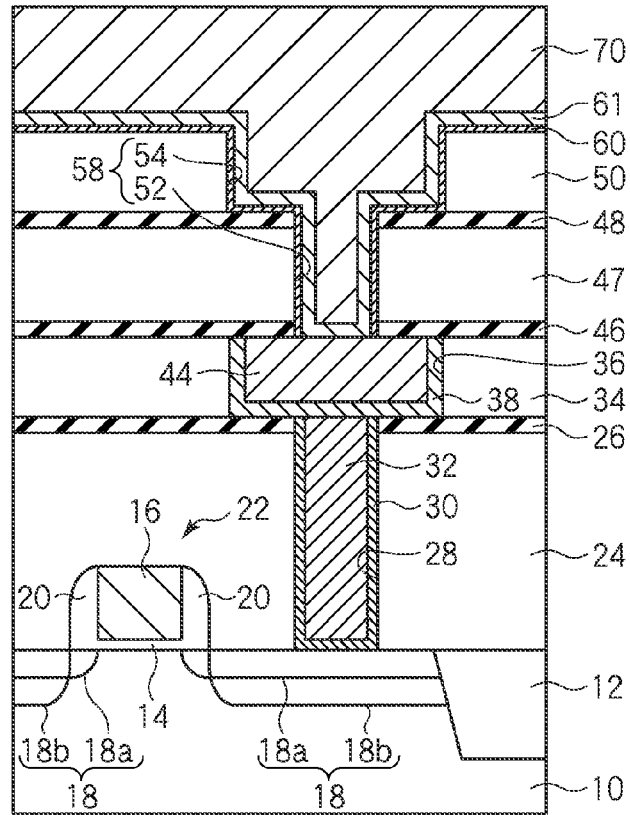
Figure 21A:
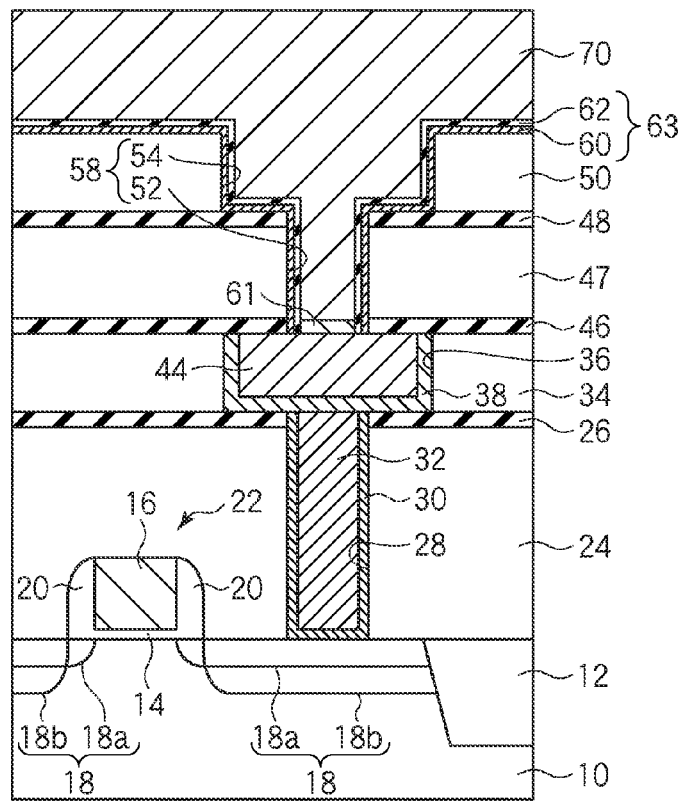
Figure 21B:
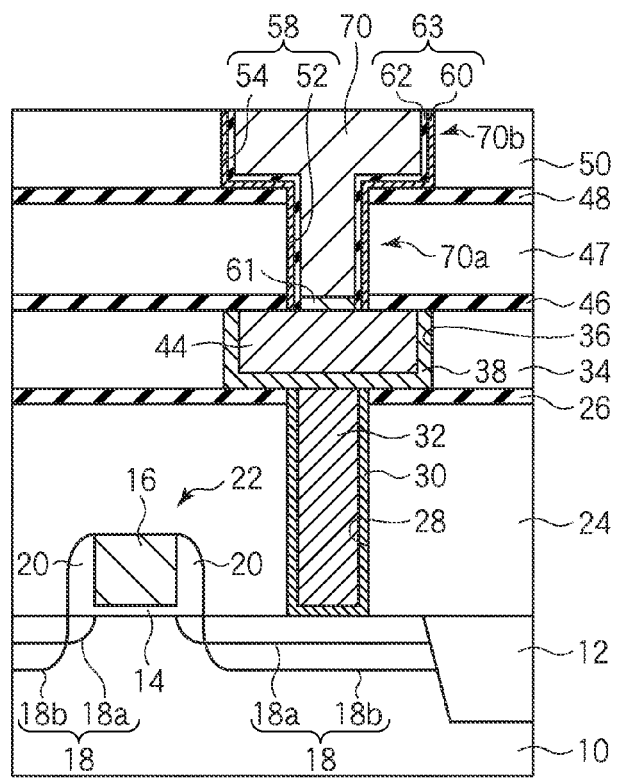

Next, as illustrated in FIG. 20B, the Cu film 70 is formed on the entire surface by electroplating using, e.g., a copper sulfate bath. In forming the Cu film 70, the CuMn film 61 functions as the seed film. Thus, in the present embodiment, it is not necessary to form a seed film separate from the CuMn film 61.

Then, thermal processing is made. The thermal processing temperature is, e.g., about 400° C. The thermal processing period of time is about 300 seconds. By the thermal processing, oxygen is emitted from the inter-layer insulation films 47, 50, etc. The $ZrB_2$ film 60 is a polycrystalline film, and the oxygen emitted from the inter-layer insulation films 47, 50, etc. passes through the grain boundaries of the $ZrB_2$ film 60 and arrives at the CuMn film 61. Thus, the oxygen emitted from the inter-layer insulation films 47, 50, etc. reacts with the Mn atoms in the CuMn film 61, and the $MnO_x$ film 62 is formed (see FIG. 21A). The $MnO_x$ film 62 is formed on the side surfaces of the contact holes 52 with the $ZrB_2$ film 60 formed in and on the side surfaces and the bottom surfaces of the trenches 54 with the $ZrB_2$ film 60 formed in. The film thickness of the $MnO_x$ film 62 is, e.g., about 2-5 nm. At the bottoms of the contact holes 52, the oxygen is not supplied to the CuMn film 61, and the $MnO_x$ film 62 is not formed. Thus, at the bottoms of the contact holes 52, the CuMn film 61 remains on the $ZrB_2$ film 60.

The thermal processing is made as one independent step here but may not be made as one independent step. That is, the thermal processing is not made on this state, but heating is made in forming the insulation film, etc. in a later step, whereby the $MnO_x$ film 62 can be formed. The $MnO_x$ film 62 can be formed also by another thermal processing in a later step. Thus, the thermal processing may not be made as one independent step on this stage.

Then, the Cu film 70, the $MnO_x$ film 62 and the $ZrB_2$ film 60 are polished by, e.g., CMP until the surface of the inter-layer insulation film 50 is exposed.

Thus, the conductor plugs 70a of Cu and the interconnections 70b of Cu are buried by dual damascene process respectively in the contact holes 52 and in the trenches 54. That is, the conductors 70 including the conductor plugs 70a, and the interconnections 70b formed integral with the conductor plugs 70a are buried in the openings 58 (see FIG. 21B).

Then, multilayer interconnections, electrode pads, etc. not illustrated are further formed.

Thus, the semiconductor device according to the present embodiment is manufactured.

As described above, in the present embodiment, the first film 60 of $ZrB_2$ on the bottoms of the contact holes 52 is removed. According to the present embodiment, the first film 60 on the bottoms of the contact holes 52 is removed, whereby the second film 61 alone of CuMn is present between the conductor plugs 70a and the interconnections 44. Thus, according to the present embodiment, the contact resistance between the conductor plugs 70a and the interconnections 44 can be reduced in comparison with the contact resistance with the first film 60 and the second film 61 being present on the bottoms of the contact holes 52.

Third Embodiment

The method for manufacturing the semiconductor device according to a third embodiment will be described with reference to FIGS. 22A to 25. FIGS. 22A to 25 are cross sectional views of the semiconductor device according to the present embodiment in the steps of the method for manufacturing the semiconductor device, which illustrate the method. The same members of the present embodiment as those of the semiconductor device according to the first and the second embodiments and the method for manufacturing the semiconductor device illustrated in FIGS. 1 to 21B are represented by the same reference numbers not to repeat or to simplify their explanation.

The semiconductor device according to the present embodiment and the method for manufacturing the semiconductor device is characterized mainly in that the first film 60 of $ZrB_2$ is formed, then that of the first film 60 on the bottoms of the contact holes 52 is selectively removed, and then the CuMn film 61 is formed.

Figure 22A:
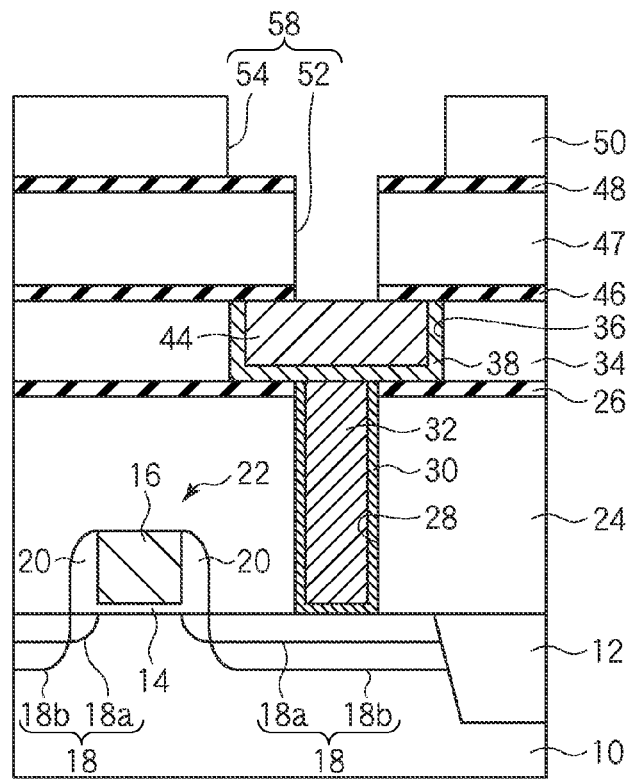
FIGS. 22A to 25 are cross sectional views of a semiconductor device according to a third embodiment in the steps of the method for manufacturing the semiconductor device, which illustrate method.

First, the step of forming the device isolation regions 12 in the semiconductor substrate 10 to the step of forming the openings 58 in the inter-layer insulation films 47, 50 are substantially the same as those of the method for manufacturing the semiconductor device according to the first embodiment described above with reference to FIGS. 2A to 6B, and their explanation will not be repeated (see FIG. 22A).

Figure 22B:
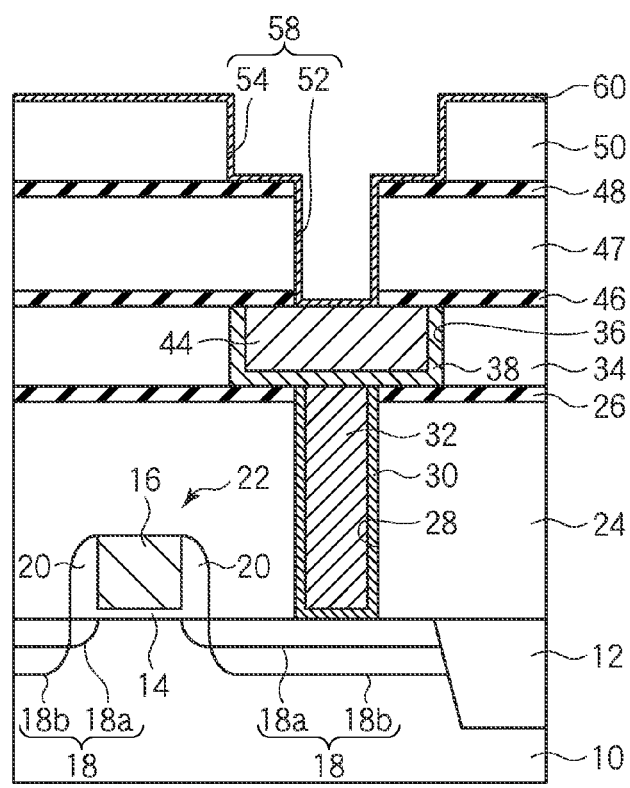

Next, in substantially the same way as in the method for manufacturing the semiconductor device according to the first embodiment described above with reference to FIG. 7A, the first film 60 of $ZrB_2$ is formed on the entire surface by, e.g., CVD (see FIG. 22B).

Figure 23A:
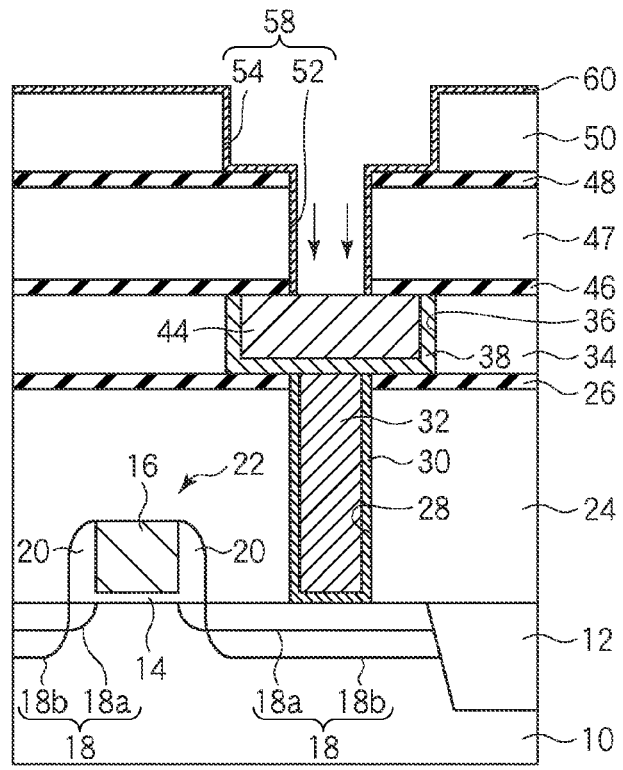

Then, as illustrated in FIG. 23A, the $ZrB_2$ film 60 on the bottoms of the contact holes 52 is selectively etched off by using, e.g., Ar ions. The conditions for selectively etching off the $ZrB_2$ film 60 on the bottoms of the contact holes 52 are as exemplified below. The target electric power is, e.g., about 1-100 kW. The substrate bias is, e.g., 200-350 W. By setting such conditions, the Ar ions are concentrated on the bottoms of the contact holes 52, and the $ZrB_2$ film 60 on the bottoms of the contact holes 52 can be selectively removed. The $ZrB_2$ film 60 on the bottoms of the contact holes 52 is removed, whereby good contact can be obtained.

The bottom surfaces of the trenches 54 is sufficiently large for the diameter of the contact holes 52, whereby the Ar ions do not concentrate on the bottom surfaces of the trenches 54. Accordingly, the $ZrB_2$ film 60 on the bottoms of the trenches 54 is not substantially etched by the Ar ions. The $ZrB_2$ film 60 on the bottom surfaces of the trenches 54 is never extinguished.

Figure 23B:
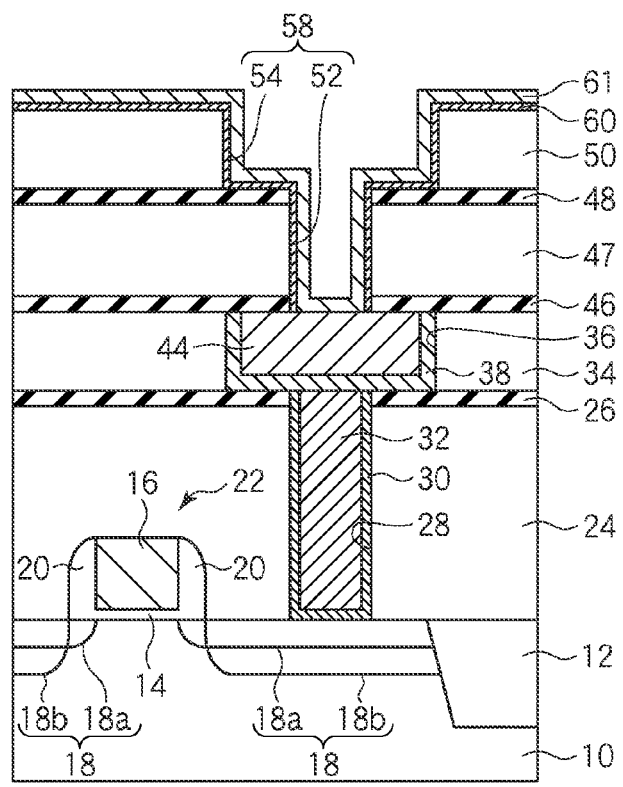

Thus, as illustrated in FIG. 23B, the CuMn film is formed on the entire surface by, e.g., physical vapor deposition. More specifically, the CuMn film 61 is formed by, e.g., sputtering. The film thickness of the CuMn film 61 is, e.g., 10-40 nm. As the target for forming the CuMn film 61, a target of CuMn of a 0.1-30 atom % Mn concentration is used. The CuMn film 61 formed by using such target has, e.g., a 0.1-10 atom % Mn concentration.

Figure 24A:
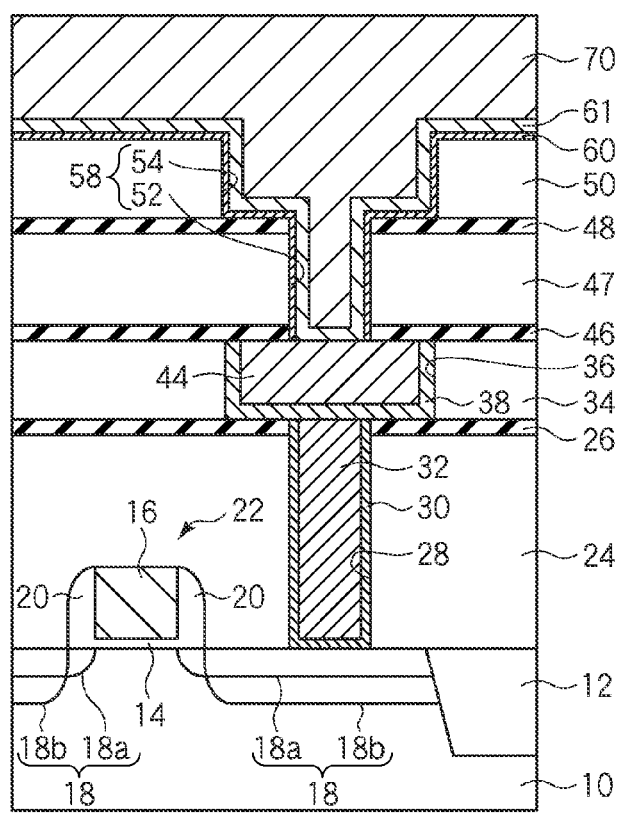
Figure 24B:
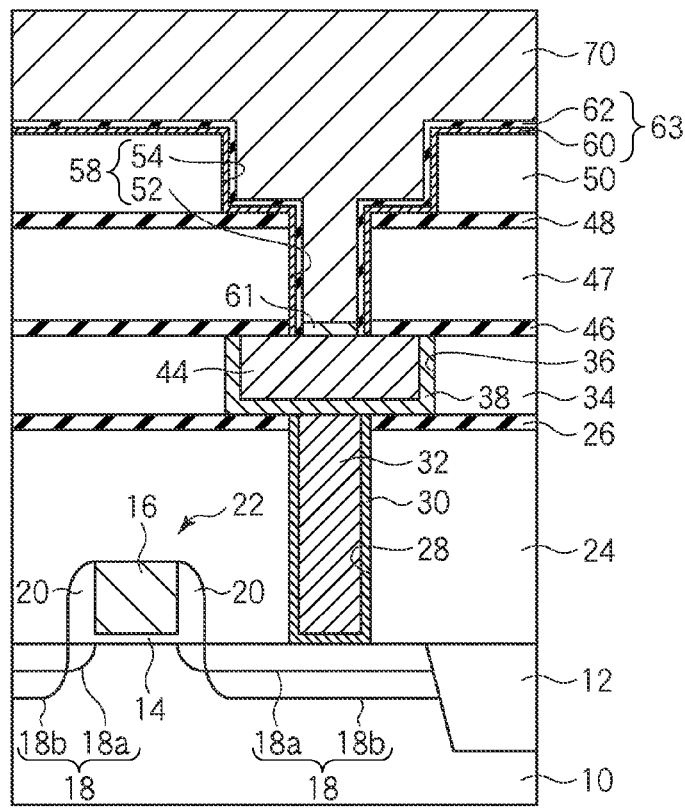
Figure 25:
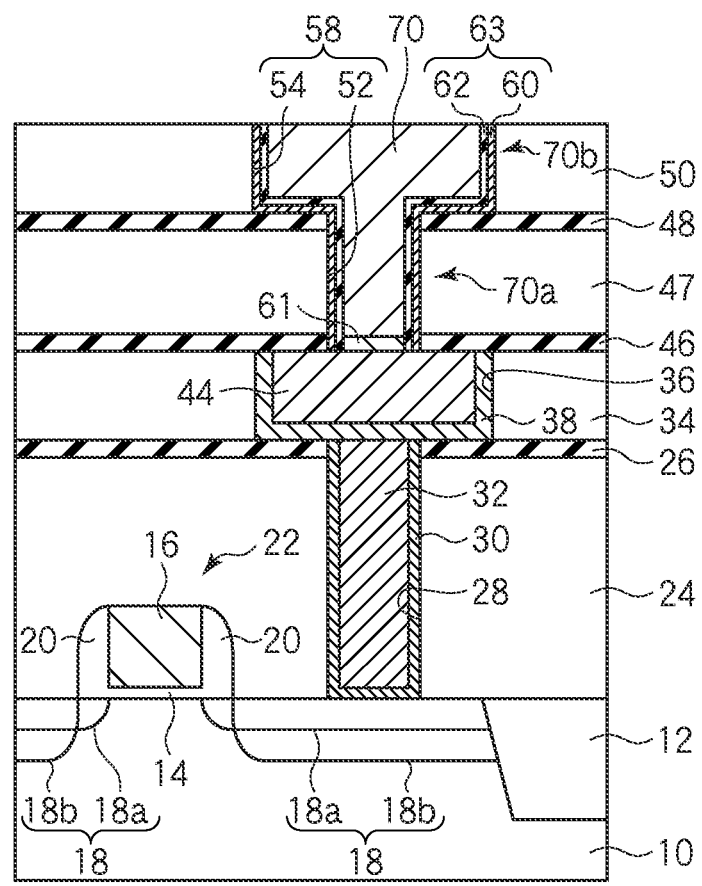

Then, as illustrated in FIG. 24A, the Cu film 70 is formed on the entire surface by electroplating using, e.g., a copper sulfate bath. When the Cu film 70 is formed, the CuMn film 61 functions as the seed film. Accordingly, in the present embodiment, it is not necessary to form a seed film separate from the CuMn film 61.

Next, thermal processing is made. The thermal processing temperature is, e.g., about 400° C. The thermal processing period of time is, e.g., about 300 seconds. By the thermal processing, oxygen is emitted from the inter-layer insulation films 47, 50, etc. The $ZrB_2$ film 60 is a polycrystalline film, and the oxygen emitted from the inter-layer insulation films 47, 50, etc. passes through the grain boundaries of the $ZrB_2$ film 60 and arrives at the CuMn film 61. Thus, the oxygen emitted from the inter-layer insulation films 47, 50, etc. reacts with the Mn atoms in the CuMn film 61, and the $MnO_x$ film 62 is formed (see FIG. 24B). The $MnO_x$ film 62 is formed on the side surfaces of the contact holes 52 with the $ZrB_2$ film 60 formed on and on the side surfaces and the bottom surfaces of the trenches 54 with the $ZrB_2$ film 60 formed on. The film thickness of the $MnO_x$ film 62 is, e.g., about 2-5 nm. At the bottoms of the contact holes 52, the oxygen is not supplied to the CuMn film 61, and the $MnO_x$ film 62 is not formed. Accordingly, at the bottoms of the contact holes 52, the CuMn film 61 remains on the $ZrB_2$ film 60.

The thermal process is made as one independent step here but may not be made as one independent step. That is, the thermal processing may not be made on this stage, but heating is made in a later step of forming insulation films, etc., whereby the $MnO_x$ film 62 can be formed. The $MnO_x$ film 62 can be formed by another thermal processing to be made in a later step. Thus, the thermal processing may not be made as one independent step on this stage.

Then, the Cu film 70, the $MnO_x$ film 62 and the $ZrB_2$ film 60 are polished until the surface of the inter-layer insulation film 50 by, e.g., CMP.

Thus, the conductor plugs 70a of Cu and the interconnections 70b of Cu are buried by dual damascene process respectively in the contact holes 52 and in the trenches 54. That is, the conductors 70 including the conductor plugs 70a, and the interconnections 70b formed integral with the conductor plugs 70a are buried in the openings 58 (see FIG. 25).

Then, multilayer interconnections, electrode pads, etc. not illustrated are further formed.

Thus, the semiconductor device according to the present embodiment is manufactured.

As described above, the second film 61 of CuMn may be formed by forming the first film 60 of $ZrB_2$ and then selectively removing the first film 60 on the bottoms of the contact holes 52. In the present embodiment as well, the first film 60 on the bottoms of the contact holes 52 is removed, whereby the second film 61 alone is present between the conductor plugs 70a and the interconnections 44. Thus, according to the present embodiment, the contact resistance between the conductor plugs 70a and the interconnections 44 can be reduced in comparison with the contact resistance with the first film 60 and the second film 62 being present on the bottoms of the contact holes 52.

Fourth Embodiment

The semiconductor device according to a fourth embodiment and the method for manufacturing the semiconductor device will be described with reference to FIGS. 26 to 30. The same members of the present embodiment as those of the semiconductor device according to the first to the third embodiments and the method for manufacturing the semiconductor device illustrated in FIGS. 1 to 25 are represented by the same reference numbers not to repeat or to simplify their explanation.

The semiconductor device according to the present embodiment and the method for manufacturing the semiconductor device are characterized mainly in that the CuMn film 61 is removed from the bottoms of the contact holes 52.

(Semiconductor Device)

Figure 26:
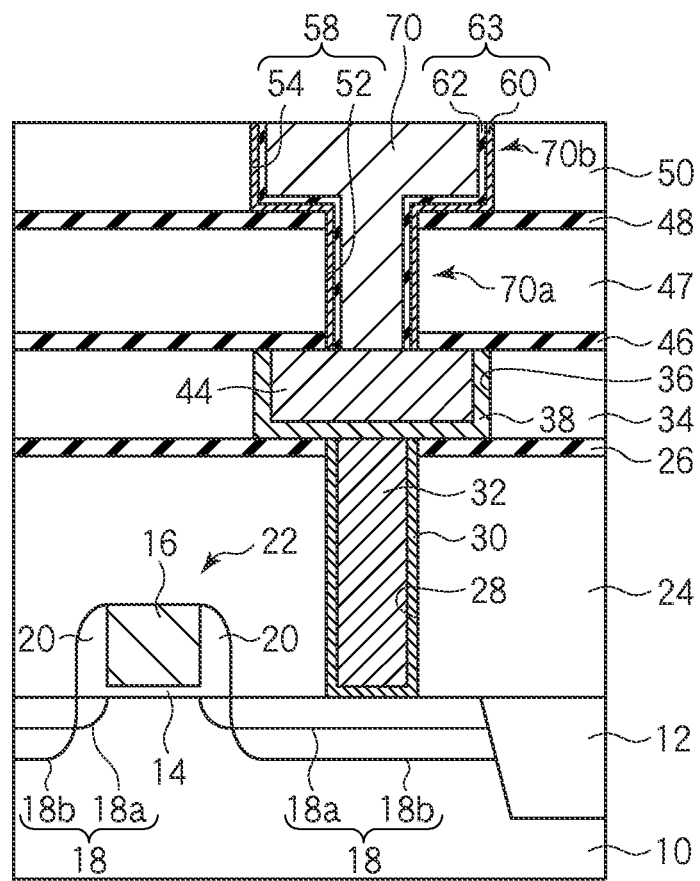
FIG. 26 is a cross sectional view of a semiconductor device according to a fourth embodiment.

First, the semiconductor device according to the present embodiment will be described with reference to FIG. 26. FIG. 26 is a cross sectional view of the semiconductor device according to the present embodiment.

As illustrated in FIG. 26, the first film 60 of a compound containing Zr is formed in the openings 58. The first film 60 is formed of $ZrB_2$ film here. The $ZrB_2$ film 60 is formed on the side surfaces of the contact holes 42 and on the side surfaces and the bottom surfaces of the trenches 54. On the bottoms of the contact holes 52, the $ZrB_2$ film 60 is removed. In the present embodiment, the $ZrB_2$ film 60 is removed from the bottoms of the contact holes 52 so as to reduce the contact resistance between the conductor plugs 70a and the interconnections 44.

The second film 62 of an oxide containing Mn is formed in the openings 58 with the $ZrB_2$ film 60 formed in. The second film 62 is formed of $MnO_x$ film here. The second film 62 is formed on the side surfaces of the contact holes 52 with the $ZrB_2$ film 60 formed on and on the side surfaces and the bottom surfaces of the trenches 54 with the $ZrB_2$ film 60 formed on.

The $ZrB_2$ film 60 and the $MnO_x$ film 62 form the base film 63.

On the bottoms of the contact holes 52, the conduction film 61 of CuMn is absent.

The conductors 70 of Cu or a Cu alloy are buried in the openings 58 with the base film 63 formed in. That is, the conductors 70 including the conductor plugs 70a, and the interconnections 70b formed integral with the conductor plugs 70a are buried in the openings 58.

On the inter-layer insulation film 50 with the conductor plugs 70a and the interconnections 70b buried in, interconnections not illustrated are further formed.

Thus, the semiconductor device according to the present embodiment is constituted.

The semiconductor device according to the present embodiment is characterized mainly in that the conduction film 61 of CuMn is removed from the bottoms of the contact holes 52. In the present embodiment, with the CuMn film 61 being removed from the bottoms of the contact holes 52, the conductor plugs 70a and the interconnections 44 are directly connected to each other. Thus, according to the present embodiment, the contact resistance between the conductor plugs 70a and the interconnections 44 can be reduced in comparison with the contact resistance with the CuMn film 61 being present on the bottoms of the contact holes 52.

(Method for Manufacturing the Semiconductor Device)

Next, the method for manufacturing the semiconductor device according to the present embodiment will be described with reference to FIGS. 27A to 30. FIGS. 27A to 30 are cross sectional views of the semiconductor device according to the present embodiment in the steps of the method for manufacturing the semiconductor device, which illustrate the method.

Figure 27A:
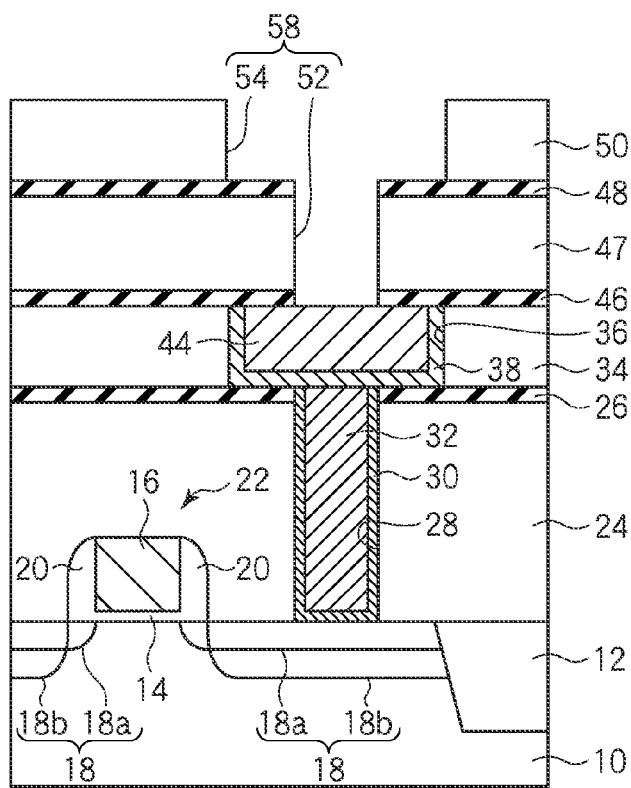
FIGS. 27A to 30 are cross sectional views of the semiconductor device according to the fourth embodiment in the steps of the method for manufacturing the semiconductor device, which illustrate method.

First, the step of forming the device isolation regions 12 in the semiconductor substrate 10 to the step of forming the openings 58 in the inter-layer insulation films 47, 50 are substantially the same as those of the method for manufacturing the semiconductor device according to the first embodiment described above with reference to FIGS. 2A to 6B, and their explanation will not be repeated (see FIG. 27A).

Figure 27B:
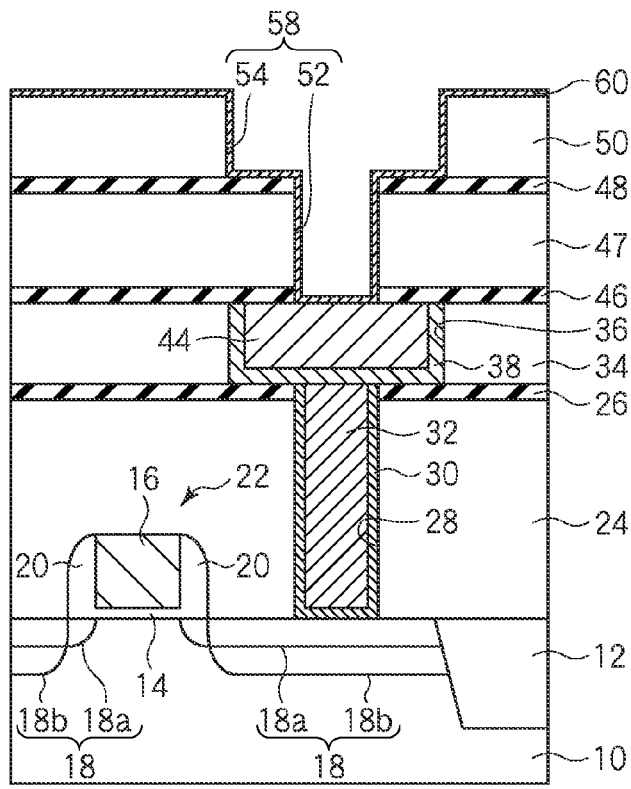

Next, in substantially the same way as in the method for manufacturing the semiconductor device according to the first embodiment described above with reference to FIG. 7A, the first film 60 of $ZrB_2$ is formed on the entire surface by, e.g., CVD (see FIG. 27B).

Figure 28A:
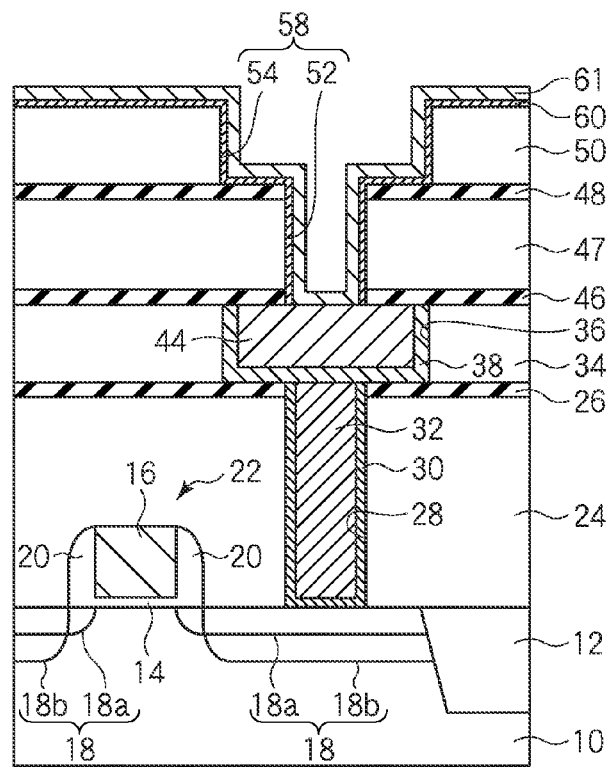

Then, as illustrated in FIG. 28A, the CuMn film is formed on the entire surface by, e.g., physical vapor deposition. More specifically, the CuMn film 61 is formed by, e.g., sputtering. The film thickness of the CuMn film 61 is, e.g., 10-40 nm. As the target for forming the CuMn film 61, a target of CuMn of a 0.1-30 atom % Mn concentration is used. The CuMn film 61 formed by using such target has, e.g., 0.1-10 atom % Mn concentration.

The CuMn film 61 is formed under the conditions for forming the CuMn film 61 on the entire surface while the $ZrB_2$ film 60 present on the bottoms of the contact holes 52 is selectively removed by Cu ions or Mn ions. The film forming conditions for the CuMn film 61 are as exemplified below. The target electric power is, e.g. about 1-100 kW. The substrate bias is, e.g., about 200-350 W. By forming the CuMn film 61 under such conditions, the CuMn film 61 can be formed on the entire surface while the $ZrB_2$ film 60 present on the bottoms of the contact holes 62 is selectively removed by Cu ion or Mn ions. With the $ZrB_2$ film 60 on the bottoms of the contact holes 52 being removed, good contact can be obtained. With the width of the trenches 54 being sufficiently large for the diameter of the contact holes 52, the $ZrB_2$ film 60 present on the bottoms of the trenches 54 is not substantially etched with the Cu ions or the Mn ions in forming the CuMn film 61. Accordingly, the $ZrB_2$ film 60 on the bottoms of the trenches 54 is never extinguished.

Figure 28B:
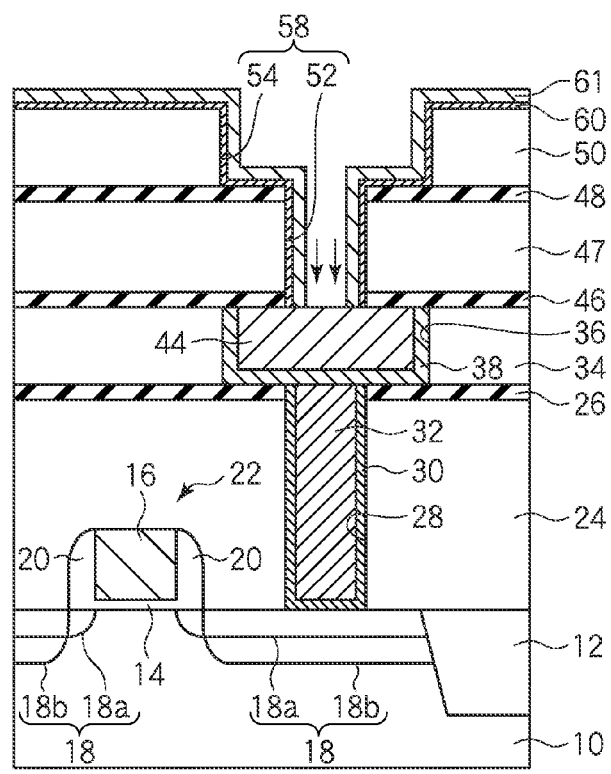

Then, as illustrated in FIG. 28B, the CuMn film 61 on the bottoms of the contact holes 52 is selectively etched off by using, e.g., Ar ions. The conditions for selectively etching off the CuMn film 61 on the bottoms of the contact holes 52 are as exemplified below. The target electric power is, e.g. about 1-10 kW. The substrate bias is, e.g., 200-400 W. Under such conditions, the Ar ions arrive concentratedly on the bottoms of the contact holes 52, and the CuMn film 61 on the bottoms of the contact holes 52 can be selectively removed. With the CuMn film 61 on the bottoms of the contact holes 52 removed, good contact can be obtained.

With the bottoms of the trenches 54 being sufficiently large for the diameter of the contact holes 52, the Ar ions are not concentrated on the bottom surfaces of the trenches 54. Accordingly, the $ZrB_2$ film 60 present on the bottom surfaces of the trenches 54 is not substantially etched with the Ar ions. Thus, the $ZrB_2$ film 60 on the bottoms of the trenches 54 is never extinguished.

Figure 29A:
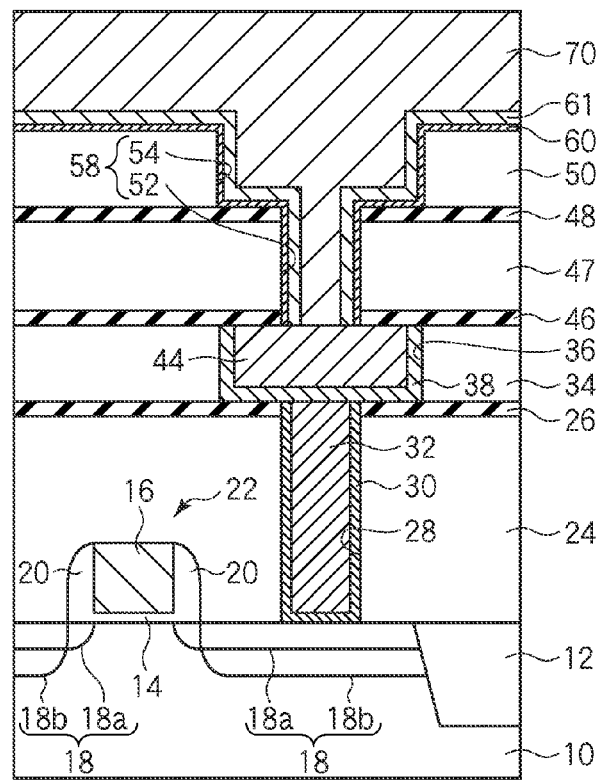
Figure 29B:
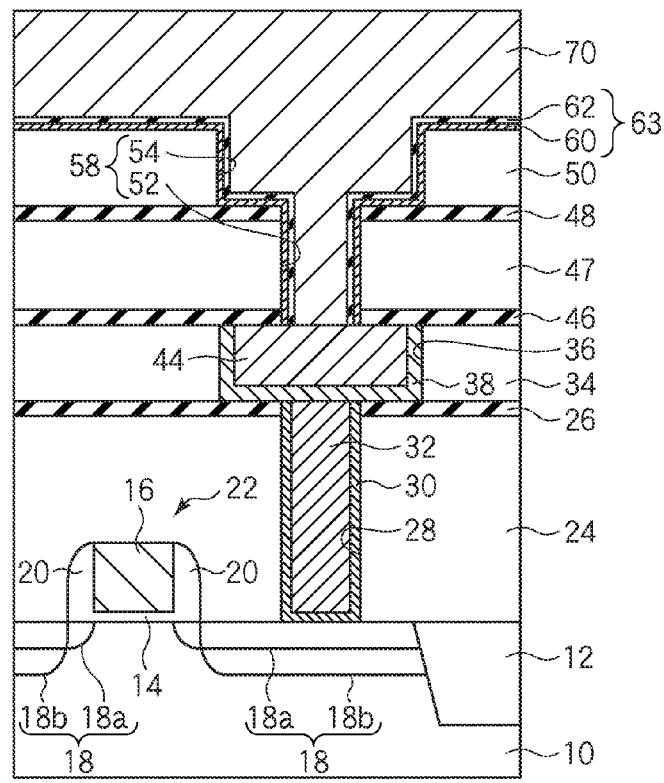
Figure 30:
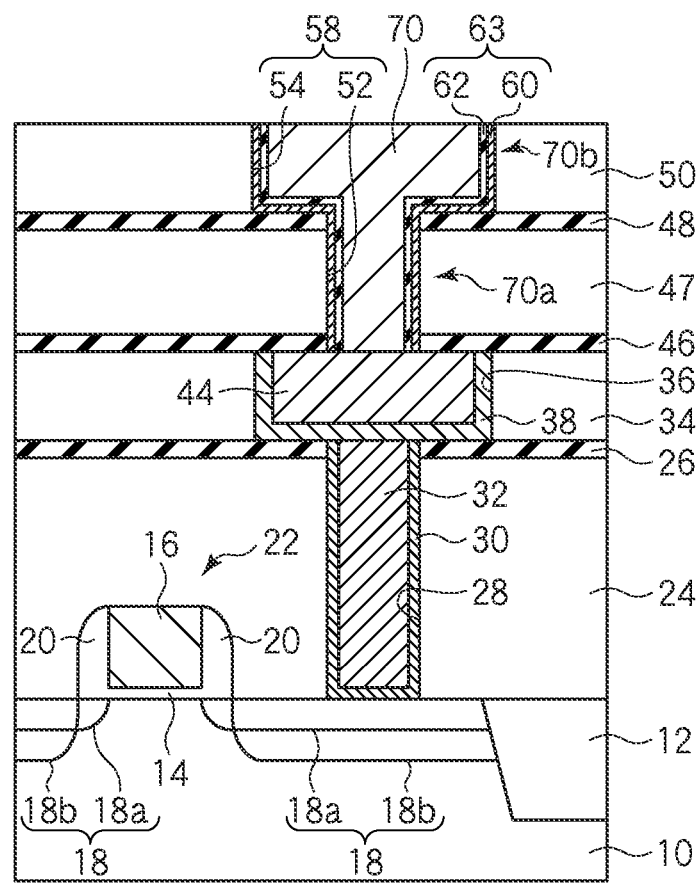

Then, as illustrated in FIG. 29A, the Cu film 70 is formed on the entire surface by electroplating using, e.g., a copper sulfate bath. In forming the Cu film 70, the CuMn film 61 functions as the seed film. Accordingly, in the present embodiment, it is not necessary to form a seed film separate from the CuMn film 61.

Next, thermal processing is made. The thermal processing temperature is, e.g., about 400° C. The thermal processing period of time is, e.g., about 180 seconds. By the thermal processing, oxygen is emitted from the inter-layer insulation films 47, 50, etc. The $ZrB_2$ film 60 is a polycrystalline film, and the oxygen emitted from the inter-layer insulation films 47, 50, etc. passes the grain boundaries of the $ZrB_2$ film 60 and arrives at the CuMn film 61. Thus, the oxygen emitted from the inter-layer insulation films 47, 50, etc. reacts with the Mn atoms in the CuMn film 61, and the $MnO_x$ film 62 is formed (see FIG. 29B). The $MnO_x$ film 62 is formed on the side surfaces of the contact holes 52 with the $ZrB_2$ film 60 formed on and on the side surfaces and the bottoms surfaces of the trenches 54 with the $ZrB_2$ film 60 formed. The film thickness of the $MnO_x$ film 62 is about, e.g., 2-5 nm.

The thermal processing is made as one independent step here but may not be made as one independent step. That is, the thermal processing is not made on this stage, but heating is made in a later step of forming insulation films, etc., whereby the $MnO_x$ film can be formed. By another thermal processing to be made in a later step, the $MnO_x$ film 62 can be formed. Thus, the thermal processing may not be made as one independent step on this stage.

Next, the Cu film 70, the MnO$_x$ film 62 and the ZrB$_2$ film 60 are polished by, e.g., CMP until the surface of the inter-layer insulation film 50 is exposed.

Thus, the conductor plugs 70a of Cu and the interconnections 70b of Cu are buried by dual damascene process respectively in the contact holes 52 and in the trenches 54. That is, the conductors 70 including the conductor plugs 70a, and the interconnections 70b formed integral with the conductor plugs 70a are buried in the openings 58 (see FIG. 30).

Then, multilayer interconnections, electrode pads, etc. not illustrated are further formed.

Thus, the semiconductor device according to the present embodiment is manufactured.

As described above, according to the present embodiment, the CuMn film 61 on the bottoms of the contact holes 52 is removed, whereby the conductor plugs 70a and the interconnections 44 are directly connected to each other. Thus, according to the present embodiment, the contact resistance between the conductor plugs 70a and the interconnections 44 can be further reduced in comparison with the contact resistance with the CuMn film 61 being present on the bottoms of the contact holes 52.

Fifth Embodiment

The semiconductor device according to a fifth embodiment and the method for manufacturing the semiconductor device will be described with reference to FIGS. 31A to 34B. FIGS. 31A to 34B are cross sectional views of the semiconductor device according to the present embodiment in the steps of the method for manufacturing the semiconductor device, which illustrate the method. The same members of the present embodiment as those of the semiconductor device according to the first to the fourth embodiments and the method for manufacturing the semiconductor device illustrated in FIGS. 1 to 30 are represented by the same reference numbers not to repeat or to simplify their explanation.

The method for manufacturing the semiconductor device according to the present embodiment is characterized mainly in that the first film 60 of ZrB$_2$ is formed, then the first film 60 on the bottoms of the contact holes 52 is removed, then the CuMn film 61 is formed, and then, the CuMn film 61 on the bottoms of the contact holes 52 is removed.

Figure 31A:
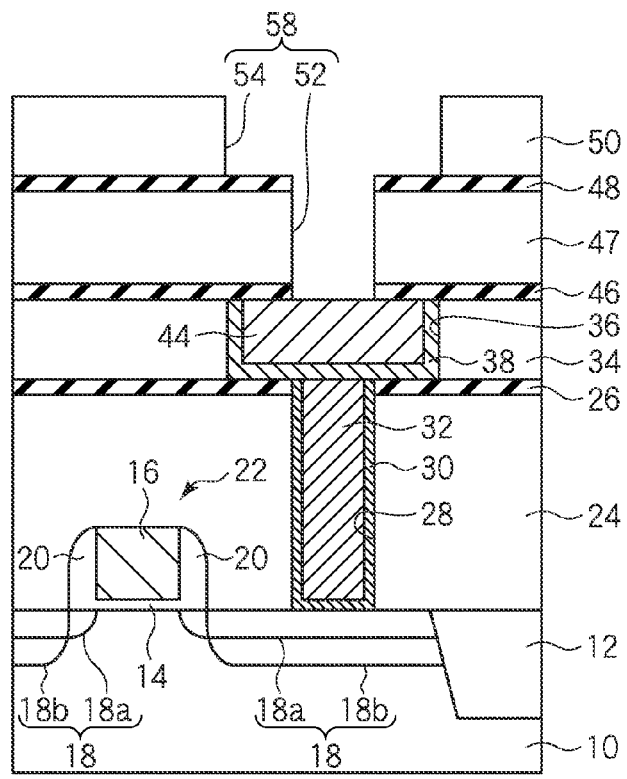
FIGS. 31A to 34B are cross sectional views of a semiconductor device according to a fifth embodiment in the steps of the method for manufacturing the semiconductor device, which illustrate method.

First, the step of forming the device isolation regions 12 in the semiconductor substrate 10 to the step of forming the openings 58 in the inter-layer insulation films 47, 50 are substantially the same as those of the method for manufacturing the semiconductor device according to the first embodiment described above with reference to FIGS. 2A to 6B, and their explanation will not be repeated (see FIG. 31A).

Figure 31B:
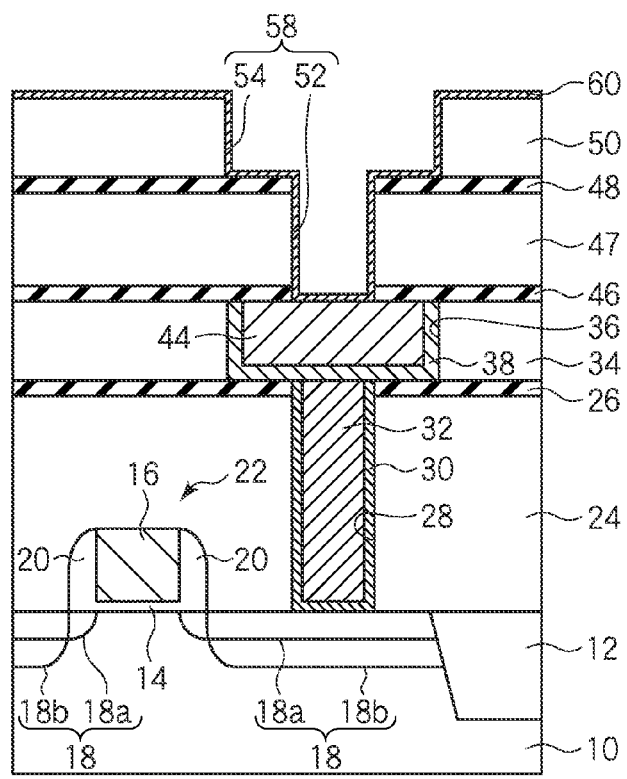

Next, in substantially the same way as in the method for manufacturing the semiconductor device according to the first embodiment described above with reference to FIG. 7A, the first film 60 of ZrB$_2$ is formed on the entire surface by, e.g., CVD (see FIG. 31B).

Figure 32A:
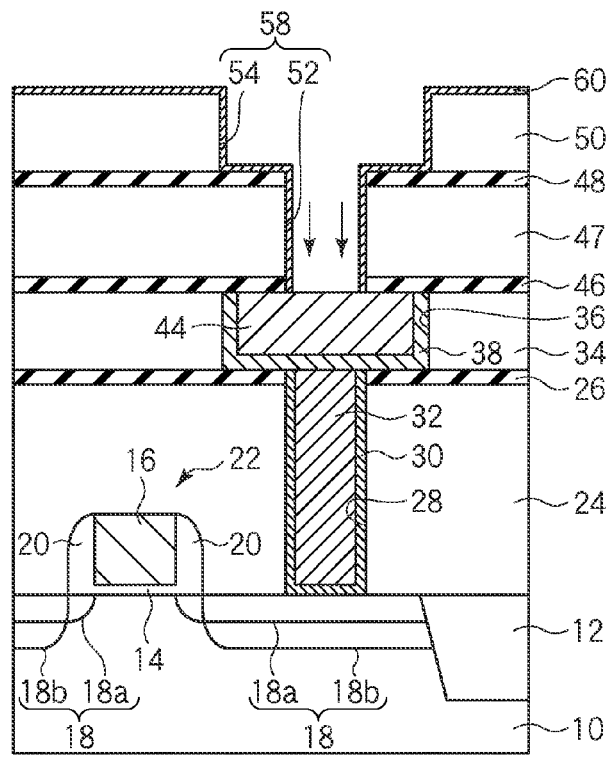

Then, as illustrated in FIG. 32A, the ZrB$_2$ film 60 on the bottoms of the contact holes 52 is selectively etched off by using, e.g., Ar ions. The conditions for selectively etching off the ZrB$_2$ film 60 on the bottoms of the contact holes 52 are exemplified below. The target electric power is, e.g., about 1-100 kW. The substrate bias is, e.g., 200-350 W. Under these conditions, the Ar ions arrive concentratedly at the bottoms of the contact holes 52, and the ZrB$_2$ film 60 on the bottoms of the contact holes 52 can be selectively removed. With the ZrB$_2$ film 60 on the bottoms of the contact holes 52 being removed, good contact can be obtained.

With the bottoms of the trenches 54 being sufficiently large for the diameter of the contact holes 52, the Ar ions are not concentrated on the bottoms of the trenches 54. Accordingly, the ZrB$_2$ film 60 present on the bottoms of the trenches 54 is not substantially etched. Thus, the ZrB$_2$ film 60 on the bottoms of the trenches 54 is never extinguished.

Figure 32B:
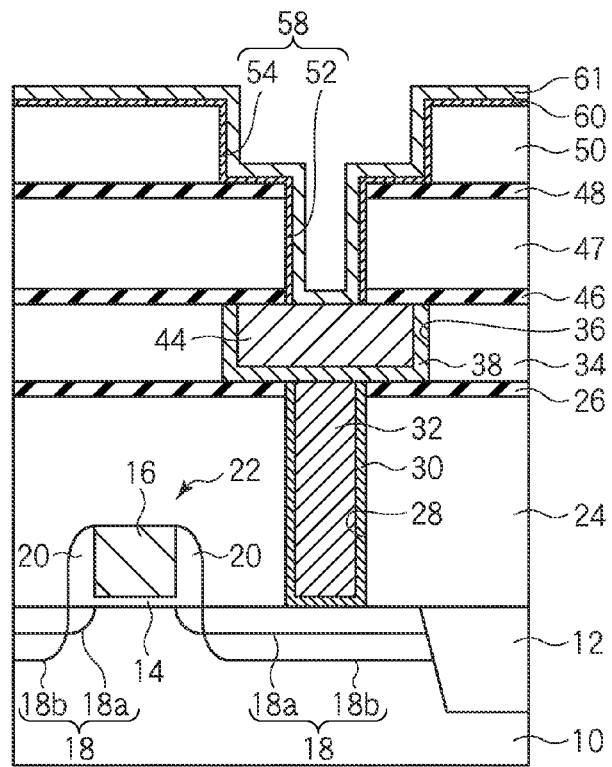

Then, as illustrated in FIG. 32B, the CuMn film 61 is formed on the entire surface by, e.g., physical vapor deposition. More specifically, the CuMn film 61 is formed by, e.g., sputtering. The film thickness of the CuMn film 61 is, e.g., 10-40 nm. As the target for forming the CuMn film 61, a target of CuMn of a 0.1-30 atom % Mn concentration is used. The CuMn film 61 formed by using such target has an Mn concentration of, e.g., 0.1-10 atom %.

Figure 33A:
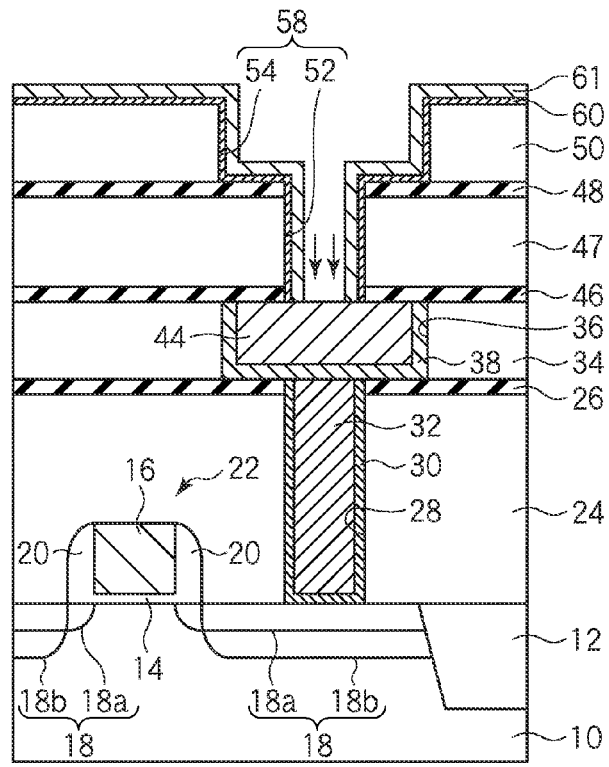

Next, as illustrated in FIG. 33A, the CuMn film 61 on the bottoms of the contact holes 52 is selectively etched off by using, e.g., Ar ions. The conditions for selectively etching off the CuMn film 61 on the bottoms of the contact holes 52 are as exemplified below. The target electric power is, e.g., about 1-10 kW. The substrate bias is, e.g., 200-400 W. Under these conditions, the Ar ions arrive concentratedly at the bottoms of the contact holes 52, and the CuMn film 61 on the bottoms of the contact holes 52 can be selectively removed. With the CuMn film 61 on the bottoms of the contact holes 52 being removed, good contact can be obtained.

With the bottoms surfaces of the trenches 54 being sufficiently large for the diameter of the contact holes 52, the Ar ions are not concentrated on the bottoms of the trenches 54. Accordingly, the ZrB$_2$ film 60 present on the bottom surfaces of the trenches 54 is not substantially etched. Thus, the ZrB$_2$ film 60 on the bottom surfaces of the trenches 54 is never extinguished.

Figure 33B:
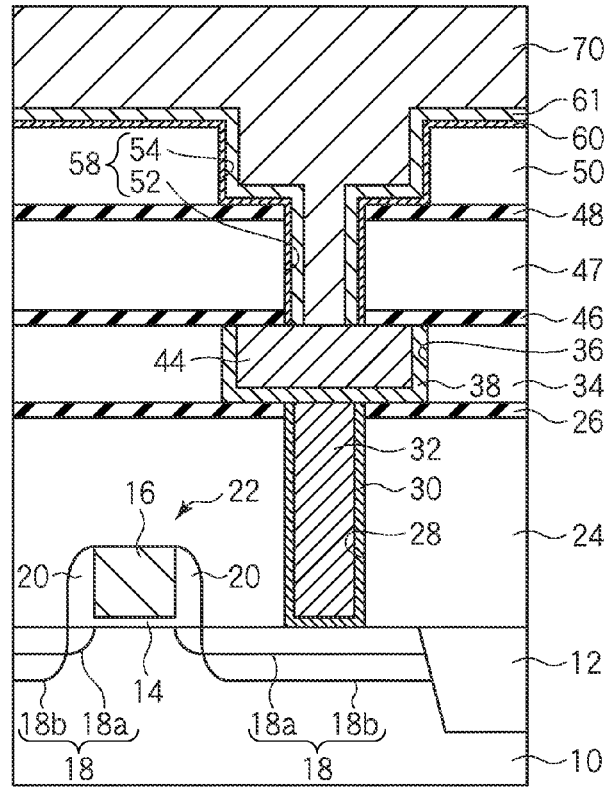
Figure 34A:
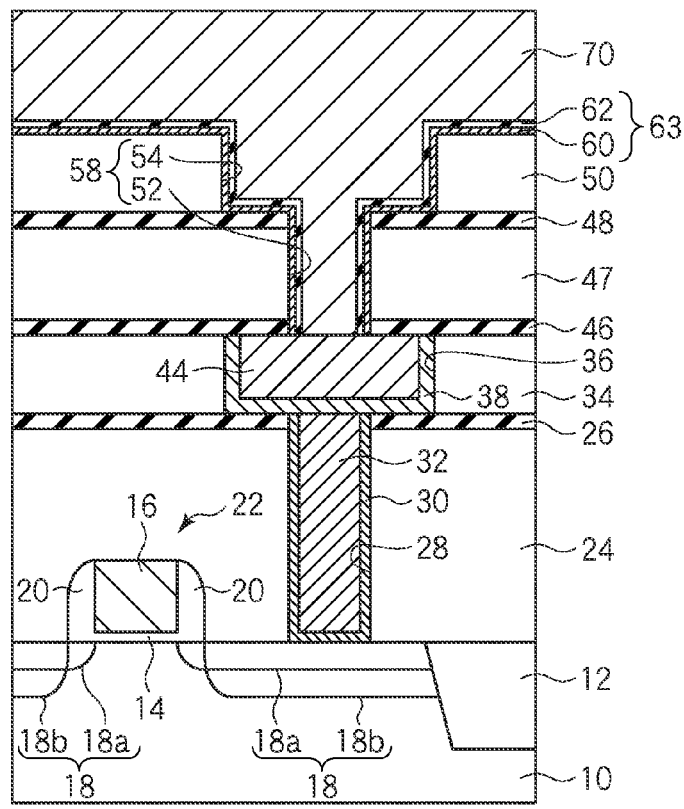
Figure 34B:
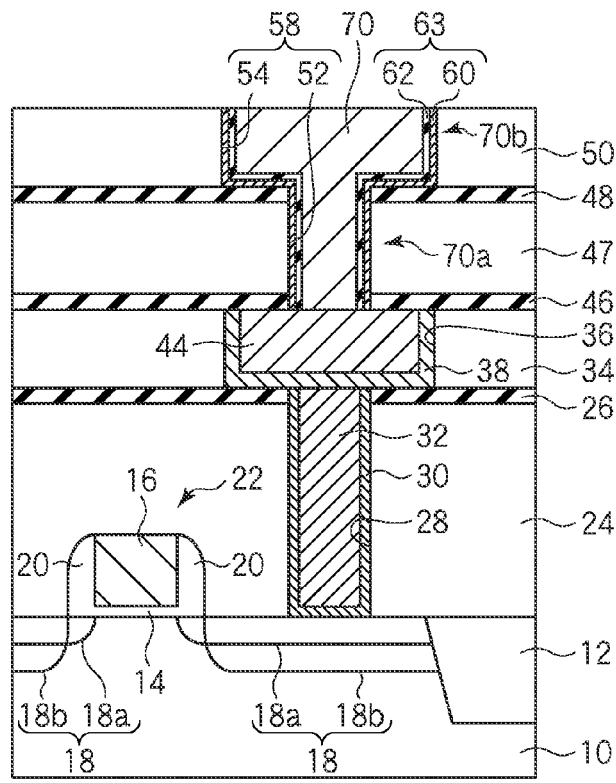

Next, as illustrated in FIG. 33B, the Cu film 70 is formed on the entire surface by electroplating using, e.g., a copper sulfate bath. In forming the Cu film 70, the CuMn film 61 functions as the seed film. Accordingly, in the present embodiment, it is not necessary to form a seed film separate from the CuMn film 61.

Then, thermal processing is made. The thermal processing temperature is, e.g., about 400° C. The thermal processing period of time is, e.g., about 180 seconds. By the thermal processing, oxygen is emitted from the inter-layer insulation films 47, 50, etc. The ZrB$_2$ film 60 is a polycrystalline film, and the oxygen emitted from the inter-layer insulation films 47, 50, etc. passes the grain boundaries of the ZrB$_2$ film 60 and reaches the CuMn film 61. Thus, the oxygen emitted from the inter-layer insulation films 47, 50, etc. reacts with the Mn atoms in the CuMn film 61, and the MnO$_x$ film 62 is formed (see FIG. 34A). The MnO$_x$ film 62 is formed on the side surfaces of the contact holes 52 with the ZrB$_2$ film 60 formed on and on the side surfaces and the bottom surfaces of the trenches 54 with the ZrB$_2$ film 60 formed on. The film thickness of the MnO$_x$ film 62 is, e.g., about 1-5 nm.

The thermal process is made as one independent step here but may not be made as one independent step. That is, the thermal processing is not made on this stage but is made in a later step for forming insulation films etc., whereby the MnO$_x$ film 62 can be formed. The MnO$_x$ film 62 can be formed by another thermal processing to be made in a later step. Thus, the thermal processing may not be made as one independent step on this stage.

Then, the Cu film 70, the MnO$_x$ film 62 and the ZrB$_2$ film 60 are polished by, e.g., CMP until the surface of the inter-layer insulation film 50 is exposed.

Thus, the conductor plugs 70a of Cu and the interconnections 70b of Cu are buried by dual damascene process respectively in the contact holes 52 and in the trenches 54. That is, the conductors 70 including the conductor plugs 70a, and the interconnections 70b formed integral with the conductor plugs 70a are buried in the openings 58 (see FIG. 34B).

Then, multilayer interconnections, electrode pads, etc. not illustrated are further formed.

Thus, the semiconductor device according to the present embodiment is manufactured.

As described above, it is possible to form the first film 60 of $ZrB_2$, then remove the first film 60 on the bottoms of the contact holes 52, then form the CuMn film 61 and then remove the CuMn film 61 on the bottoms of the contact holes 52. In the present embodiment as well, the CuMn film 61 on the bottoms of the contact holes 52 is removed, whereby the conductor plugs 70a and the interconnections 44 are connected directly to each other. Thus, according to the present embodiment, the contact resistance between the conductor plugs 70a and the interconnections 44 can be further reduced in comparison with the contact resistance with the CuMn film 61 present on the bottoms of the contact holes 52.

[Modified Embodiments]

The present invention is not limited to the above-described embodiments and can cover other various modifications.

For example, in the second to the fifth embodiments, the first film 60 is formed of $ZrB_2$ film, but the first film 60 may be formed of ZrBN film, ZrN film or others.

In the above-described embodiments, the first films 60, 60a, 60b formed of a compound containing Zr are formed of $ZrB_2$ film, ZrBN film or ZrN film. However, the first film 60, 60a, 60b formed of a compound containing Zr may not be limited to $ZrB_2$ film, ZrBN film or ZrN film. For example, the first film 60 formed of a compound containing Zr can be formed of ZrMn or others.

In the above-described embodiments, the interconnections 44 are connected to the conductor plugs 70a. The conductors to be connected to the conductor plugs 70a are not limited to the interconnections 44. For example, the conductor plugs 70a may be connected to other conductor plugs (not illustrated) buried in lower layers.

In the above-described embodiments, the first film 60, 60a, 60b formed of a compound containing Zr is a single-layer film. However, the first film 60, 60a, 60b is not limited to a single-layer film. For example, the first film 60, 60a, 60b may be formed of a layer film including a $ZrB_2$ film, ZrBN film or ZrN film.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device comprising:
a first conductor formed over a semiconductor substrate;
an insulation film formed over the semiconductor substrate and the first conductor and having an opening reaching to the first conductor;
a first film formed in the opening and formed of a compound containing Zr;
a second film formed over the first film in the opening and formed of an oxide containing Mn; and
a second conductor buried in the opening and containing Cu; wherein
the second film is formed between the first film and the second conductor,
the opening includes a contact hole reaching to the first conductor and a trench connected to a top of the contact hole,
the second film is formed on a side surface of the contact hole and on a side surface and a bottom surface of the trench,
the second conductor is in contact with the first conductor at a bottom of the contact hole.

2. The semiconductor device according to claim 1, wherein the first film is a $ZrB_2$ film, ZrBN film or ZrN film.

3. The semiconductor device according to claim 1, where in
the first film is a layer film including a $ZrB_2$ film, ZrBN film or ZrN film.

4. A semiconductor device comprising:
a first conductor formed over a semiconductor substrate;
an insulation film formed over the semiconductor substrate and the first conductor and having an opening reaching to the first conductor;
a polycrystalline first film formed in the opening;
a second film formed over the first film in the opening and formed of an oxide containing Mn; and
a second conductor buried in the opening and containing Cu; wherein
the second film is formed between the first film and the second conductor,
the opening includes a contact hole reaching to the first conductor and a trench connected to a top of the contact hole,
the second film is formed on a side surface of the contact hole and on a side surface and a bottom surface of the trench,
the second conductor is in contact with the first conductor at a bottom of the contact hole.

5. The semiconductor device according to claim 4, wherein the first film is formed of a compound containing Zr.

6. The semiconductor device according to claim 4, wherein the first film is a $ZrB_2$ film.

7. The semiconductor device according to claim 1, wherein the first film contains no carbon.

* * * * *